United States Patent
Sasaki et al.

(10) Patent No.: US 11,832,531 B2
(45) Date of Patent: Nov. 28, 2023

(54) SPIN-ORBIT TORQUE MAGNETIZATION ROTATIONAL ELEMENT, SPIN-ORBIT TORQUE MAGNETORESISTANCE EFFECT ELEMENT, MAGNETIC MEMORY, AND RESERVOIR ELEMENT

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 290 days.

(21) Appl. No.: 17/296,896

(22) PCT Filed: Jan. 31, 2019

(86) PCT No.: PCT/JP2019/003376
§ 371 (c)(1),
(2) Date: May 25, 2021

(87) PCT Pub. No.: WO2020/157912
PCT Pub. Date: Aug. 6, 2020

(65) Prior Publication Data
US 2022/0029089 A1    Jan. 27, 2022

(51) Int. Cl.
*H10N 52/80* (2023.01)
*H10B 61/00* (2023.01)
(Continued)

(52) U.S. Cl.
CPC ............. *H10N 52/80* (2023.02); *H10B 61/00* (2023.02); *H10N 52/101* (2023.02); *H10N 52/01* (2023.02)

(58) Field of Classification Search
CPC ...... H10N 52/80; H10N 52/101; H10N 50/00; H10N 50/01; H10N 50/10; H10N 50/20;
(Continued)

(56) References Cited

U.S. PATENT DOCUMENTS

| 8,350,347 B2 | 1/2013 | Gaudin et al. |
| 2015/0348606 A1 | 12/2015 | Buhrman et al. |

(Continued)

FOREIGN PATENT DOCUMENTS

| JP | 2017-216286 A | 12/2017 |
| JP | 6462191 B1 | 1/2019 |
| WO | 2016/021468 A1 | 2/2016 |

OTHER PUBLICATIONS

Apr. 16, 2019 International Search Report issued in International Patent Application No. PCT/JP2019/003376.
(Continued)

*Primary Examiner* — Latanya N Crawford Eason
(74) *Attorney, Agent, or Firm* — Oliff PLC

(57) ABSTRACT

A spin-orbit torque magnetization rotational element includes: a first insulating layer with first and second openings; a first conductive portion formed inside the first opening; a second conductive portion formed inside the second opening; a spin-orbit torque wiring located in a first direction and extends in a second direction over the first and second conductive portions; and a first ferromagnetic layer located on the side opposite to the first insulating layer in the spin-orbit torque wiring, wherein the first conductive portion includes a first surface facing the spin-orbit torque wiring, a second surface facing the first surface and is located at a position farther from the spin-orbit torque wiring than the first surface, and a side surface connecting the first surface and the second surface, and the side surface includes a continuous major surface and a third surface inclined or curved and is discontinuous with respect to the major surface.

13 Claims, 15 Drawing Sheets

(51) Int. Cl.
*H10N 52/00* (2023.01)
*H10N 52/01* (2023.01)

(58) Field of Classification Search
CPC ........ H10N 50/80; H10N 50/85; H10N 52/00; H10N 52/01; H10N 52/85; H10N 59/00; H10B 61/00

See application file for complete search history.

(56) References Cited

U.S. PATENT DOCUMENTS

| | | | |
|---|---|---|---|
| 2016/0225423 A1 | 8/2016 | Naik et al. | |
| 2017/0222135 A1 | 8/2017 | Fukami et al. | |
| 2019/0333560 A1 | 10/2019 | Sasaki et al. | |
| 2021/0151665 A1* | 5/2021 | Komura | G11C 11/161 |

OTHER PUBLICATIONS

Y.K.Kato et al., "Observation of the Spin Hall Effect in Semiconductors" Science, 306, pp. 1910-1913 (2004).

I.M.Miron et al., "Perpendicular switching of a single ferromagnetic layer induced by in-plane current injection" Nature, 476, pp. 189-193 (2011).

KS. Lee et al., "Threshold current for switching of a perpendicular magnetic layer induced by spin Hall effect" Applied Physics Letters, 102, pp. 112410-1-112410-5 (2013).

KS. Lee et al., "Thermally activated switching of perpendicular magnet by spin-orbit spin torque" Applied Physics Letters, 104, pp. 072413-1-072413-4 (2014).

L. Liu et al., "Spin torque switching with the giant spin Hall effect of tantalum" Science, 336, 555 (2012) pp. 1-19 and 1-12.

L. Liu et al., "Current-Induced Switching of Perpendicularly Magnetized Magnetic Layers Using Spin Torque from the Spin Hall Effect" Physical Review Letters, 109, pp. 096602-1-096602-5, (2012).

T. Kimura et. al., "Electrical Control of the Direction of Spin Accumulation" Physical Review Letters 99, pp. 166601-1-166601-4 (2007).

S. Fukami et al., "Magnetization switching by spin-orbit torque in an antiferromagnet-ferromagnet bilayer system" nature materials, 15, pp. 535-541, (2016).

S. Fukami et al., "A spin-orbit torque switching scheme with collinear magnetic easy axis and current configuration" nature nanotechnology, 11, 621 (2016) pp. 1-6.

S. Takahashi et al., "Spin injection and detection in magnetic nanostructures" Physical Review B 67, pp. 052409-1-052409-4 (2003).

Y.Seo et al., "Area-Efficient SOT-MRAM With a Schottky Diode" IEEE Electron Device Letters, vol. 37, No. 8, pp. 982-985 (2016).

W. Zhang et al., "Spin Hall Effects in Metallic Antiferromagnets" Physical Review Letters, 113, pp. 196602-1-196602-6 (2014).

H.Sato et al., "Perpendicular-anisotropy CoFeB—MgO magnetic tunnel junctions with a MgO/CoFeB/Ta/CoFeB/MgO recording structure" Applied Physics Letters 101, pp. 022414-1-022414-4 (2012).

L. Liu et. al., "Magnetic Oscillations Driven by the Spin Hall Effect in 3-Terminal Magnetic Tunnel Junction Devices" Physical Review Letters 109, 186602-1-186602-5 (2012).

* cited by examiner

SPIN-ORBIT TORQUE MAGNETIZATION ROTATIONAL ELEMENT, SPIN-ORBIT TORQUE MAGNETORESISTANCE EFFECT ELEMENT, MAGNETIC MEMORY, AND RESERVOIR ELEMENT

TECHNICAL FIELD

The present invention relates to a spin-orbit torque magnetization rotational element, a spin-orbit torque magnetoresistance effect element, a magnetic memory, and a reservoir element.

BACKGROUND ART

The magnetoresistance effect element is expected to be applied to magnetic sensors, high-frequency components, magnetic heads, and nonvolatile RAM (MRAM).

The magnetoresistance effect element outputs a change in the mutual magnetization directions of two ferromagnetic layers sandwiching a non-magnetic layer as a change in the resistance of the element. The magnetoresistance effect element records data by controlling the magnetization direction of the ferromagnetic layer. As a method of controlling the magnetization direction, a method using a magnetic field caused by a current and a method of using spin transfer torque (STT) generated when a current flows in the lamination direction of the magnetoresistance effect element are known. In the method using STT, since there is a need to give a potential difference in a direction penetrating the non-magnetic layer, the non-magnetic layer may be damaged in some cases.

Recently, a method of using spin-orbit torque (SOT) has been examined as a new method of controlling the magnetization direction (for example, Patent Literature 1). SOT is induced in the ferromagnetic layer by the spin current generated by the spin-orbit interaction or the Rashba effect at the interface of dissimilar materials. The magnetization is reversed by the action of SOT on the magnetization in the ferromagnetic layer. The spin current and the Rashba effect are generated when a current flows in a direction intersecting the lamination direction of the ferromagnetic layer. In the method of using SOT, since it is possible to prevent a large writing current from flowing in the lamination direction of the non-magnetic layer and the ferromagnetic layer, it is possible to suppress damage on the non-magnetic layer and the like.

CITATION LIST

Patent Literature

[Patent Literature 1]
Japanese Unexamined Patent Application, First Publication No. 2017-216286

SUMMARY OF INVENTION

Technical Problem

The magnetoresistance effect element is a recording area for recording data and is often used as a magnetic memory in which the plurality of magnetoresistance effect elements are integrated. In order to miniaturize the entire magnetic memory, it is required to increase the integration of the magnetoresistance effect elements.

The present invention has been made in view of the above-described circumstances and an object of the present invention is to provide a spin-orbit torque magnetization rotational element and a spin-orbit torque magnetoresistance effect element capable of improving integration. Another object of the present invention is to provide a magnetic memory and a reservoir element with high integration.

Solution to Problem

The magnetoresistance effect element is used while being connected to a semiconductor element. It has been found that the integration can be improved by removing a part of a conductive portion connecting the magnetoresistance effect element and the semiconductor element to form an inclined surface.

That is, the present invention provides the following means in order to solve the above-described problems.

(1) A spin-orbit torque magnetization rotational element according to a first aspect includes: a first insulating layer with a first opening and a second opening; a first conductive portion formed inside the first opening; a second conductive portion formed inside the second opening; a spin-orbit torque wiring located in a first direction of the first insulating layer and extends in a second direction over the first conductive portion and the second conductive portion when viewed from the first direction; and a first ferromagnetic layer located on the side opposite to the first insulating layer in the spin-orbit torque wiring, wherein the first conductive portion includes a first surface facing the spin-orbit torque wiring, a second surface facing the first surface and is located at a position farther from the spin-orbit torque wiring than the first surface, and a side surface connecting the first surface and the second surface, and wherein the side surface includes a continuous major surface and a third surface inclined or curved with respect to the major surface and is discontinuous with respect to the major surface.

(2) In the spin-orbit torque magnetization rotational element according to the above-described aspect, the third surface may be inclined or curved with respect to the first direction.

(3) In the spin-orbit torque magnetization rotational element according to the above-described aspect, the third surface may include a first part inclined or curved with respect to the first direction and a second part inclined or curved with respect to the first part.

(4) In the spin-orbit torque magnetization rotational element according to the above-described aspect, the spin-orbit torque wiring may include a first side surface and a second side surface in the second direction and the first side surface may be continuous to at least a part of the third surface of the first conductive portion.

(5) In the spin-orbit torque magnetization rotational element according to the above-described aspect, the side surface of the first conductive portion may further include a fourth surface and a fifth surface inclined or curved with respect to the major surface and the third surface and are discontinuous with respect to the major surface and the third surface.

(6) In the spin-orbit torque magnetization rotational element according to the above-described aspect, the spin-orbit torque wiring may include a third side surface and a fourth side surface provided in a third direction intersecting the second direction, the third side surface may be continuous to at least a part of the fourth surface, and the fourth side surface may be continuous to at least a part of the fifth surface.
(7) In the spin-orbit torque magnetization rotational element according to the above-described aspect, the first ferromagnetic layer may include a first side surface and a second side surface provided in the second direction, the first side surface of the first ferromagnetic layer may be continuous to a first side surface of the spin-orbit torque wiring, and a second side surface of the first ferromagnetic layer may be continuous to the second side surface of the spin-orbit torque wiring.
(8) In the spin-orbit torque magnetization rotational element according to the above-described aspect, the first ferromagnetic layer may include a third side surface and a fourth side surface in a third direction intersecting the second direction, the third side surface of the first ferromagnetic layer may be continuous to the third side surface of the spin-orbit torque wiring, and the fourth side surface of the first ferromagnetic layer may be continuous to the fourth side surface of the spin-orbit torque wiring.
(9) In the spin-orbit torque magnetization rotational element according to the above-described aspect, the spin-orbit torque wiring may include a first side surface and a second side surface provided in the second direction and includes a third side surface and a fourth side surface provided in a third direction intersecting the second direction and an inclination angle of the first side surface with respect to the first direction may be larger than inclination angles of the third side surface and the fourth side surface with respect to the first direction.
(10) In the spin-orbit torque magnetization rotational element according to the above-described aspect, the spin-orbit torque wiring may include a first side surface and a second side surface in the second direction and an inclination angle of the first side surface with respect to the second direction may be 45° or more.
(11) The spin-orbit torque magnetization rotational element according to the above-described aspect may further include an underlayer provided between the spin-orbit torque wiring and the first ferromagnetic layer.
(12) A spin-orbit torque magnetoresistance effect element according to a second aspect includes: the spin-orbit torque magnetization rotational element according to the above-described aspect; a second ferromagnetic layer located in the first direction of the first ferromagnetic layer; and a non-magnetic layer located between the first ferromagnetic layer and the second ferromagnetic layer.
(13) A magnetic memory according to a third aspect includes: a plurality of the spin-orbit torque magnetoresistance effect elements according to the above-described aspect; and a wiring connecting the plurality of spin-orbit torque magnetoresistance effect elements.
(14) A reservoir element according to a fourth aspect includes: a plurality of the spin-orbit torque magnetization rotational elements according to the above-described aspect; and a spin conductive layer connecting the first ferromagnetic layers of the plurality of spin-orbit torque magnetization rotational elements.

Advantageous Effects of Invention

According to the spin-orbit torque magnetization rotational element and the spin-orbit torque magnetoresistance effect element of the above-described aspects, elements can be arranged with higher integration. Further, the magnetic memory and the reservoir element of the above-described aspects can be miniaturized.

DESCRIPTION OF EMBODIMENTS

Figure 1:
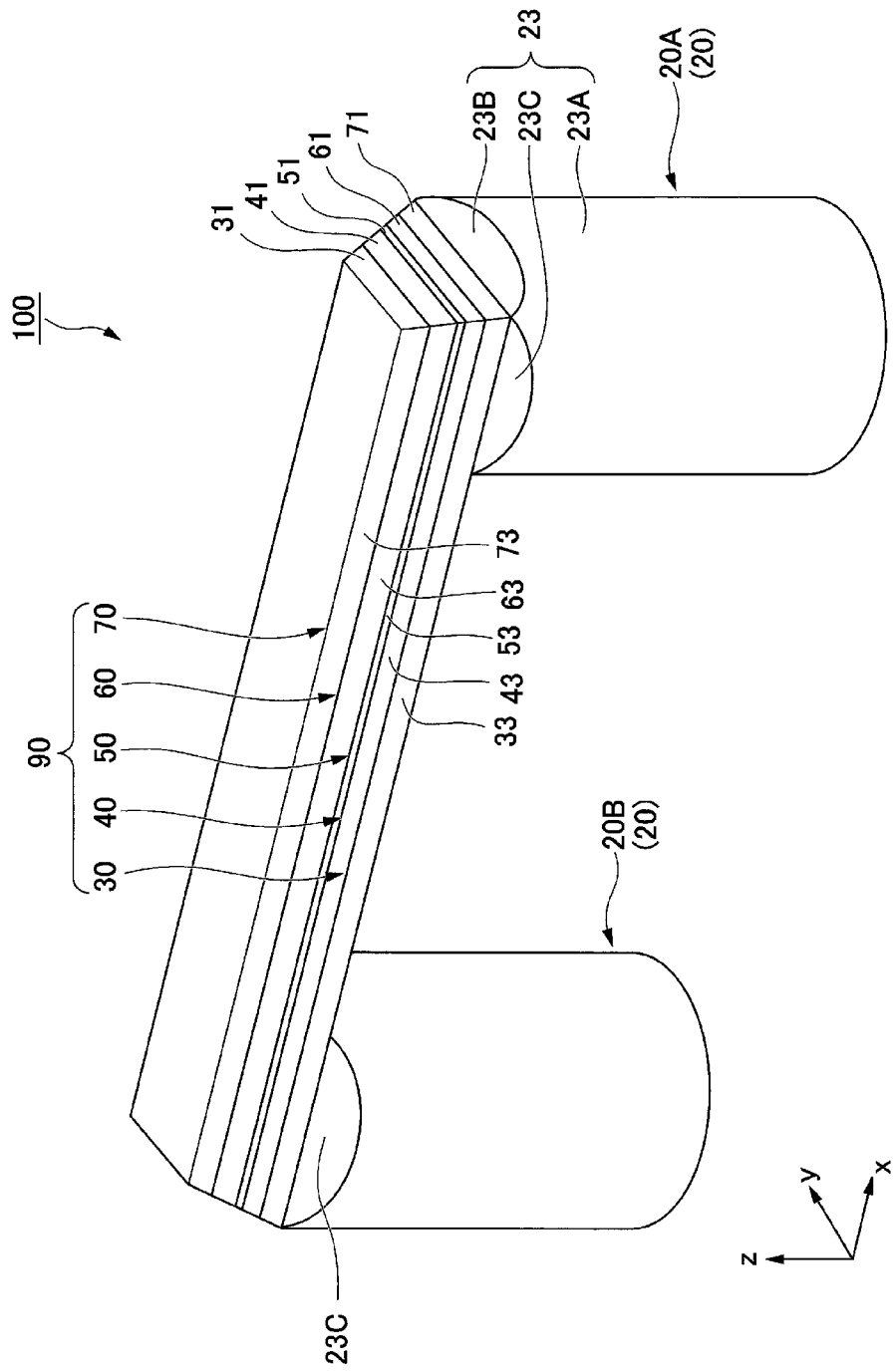
FIG. 1 is a perspective view of a spin-orbit torque magnetoresistance effect element according to a first embodiment.

Hereinafter, this embodiment will be described in detail by appropriately referring to the drawings. In the drawings used in the following description, the featured parts may be enlarged for convenience to make the features easier to understand and the dimensional ratio of each component may differ from the actual one. The materials, dimensions, and the like exemplified in the following description are examples and the present invention is not limited thereto. For example, the present invention can be appropriately modified and carried out within the range in which the effects of the present invention are exhibited.

First, directions will be defined. An x direction and a y direction are directions substantially parallel to a spin-orbit torque wiring 30 to be described later. The x direction is a direction in which the spin-orbit torque wiring 30 to be described later extends. The y direction is a direction orthogonal to the x direction. A z direction is a direction orthogonal to the x direction and the y direction. The z direction is an example of a first direction and an x direction is an example of a second direction. Further, in the present specification, "extending in the x direction" means, for example, that the dimension of the x direction is larger than the minimum dimension among the dimensions of the x direction, the y direction, and the z direction. The same applies to the case of extending in other directions.

First Embodiment (Spin-Orbit Torque Magnetoresistance Effect Element)

Figure 2:
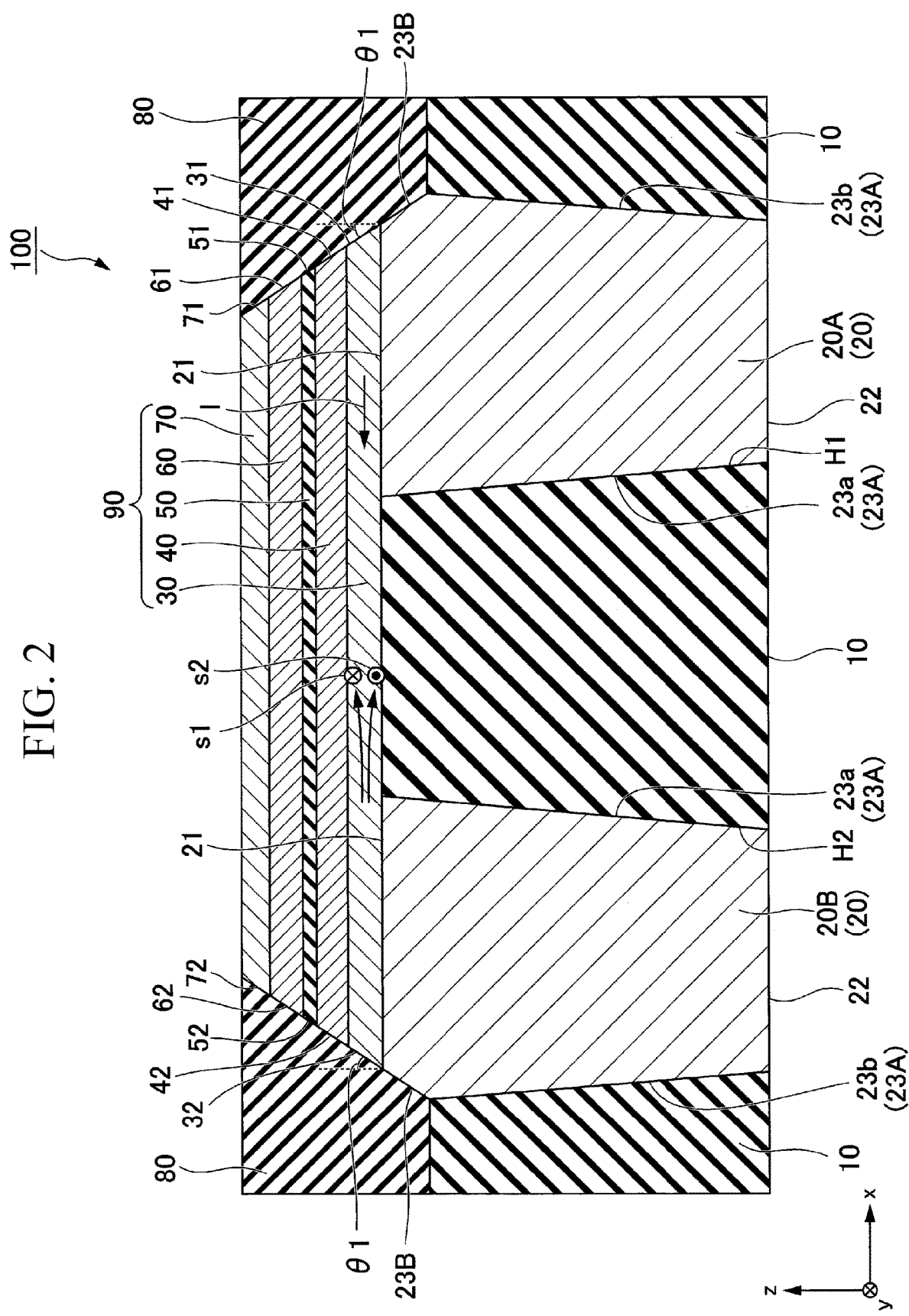
FIG. 2 is a cross-sectional view of the spin-orbit torque magnetoresistance effect element according to the first embodiment.
Figure 3:
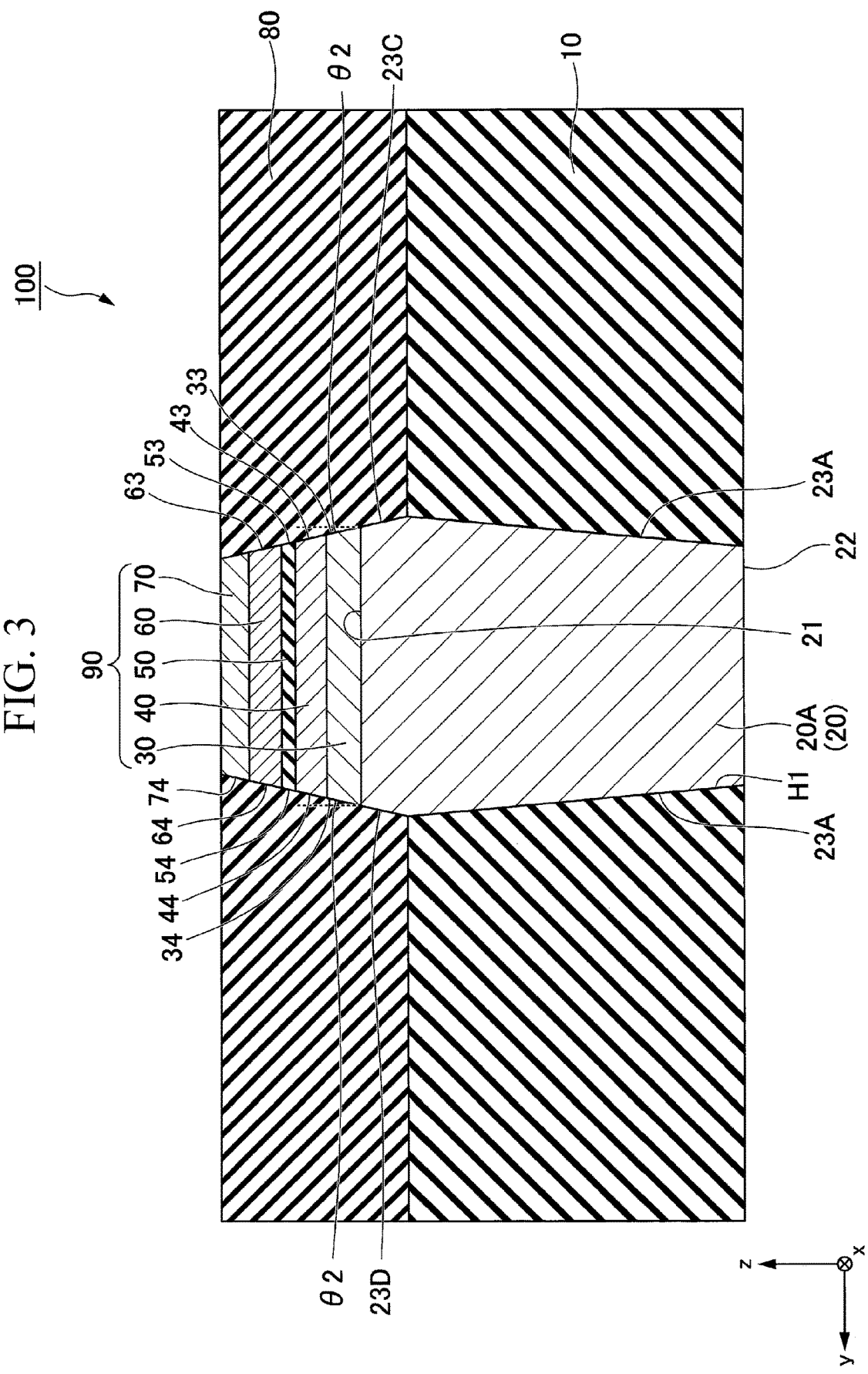
FIG. 3 is a cross-sectional view in another cut plane of the spin-orbit torque magnetoresistance effect element according to the first embodiment.
Figure 4:
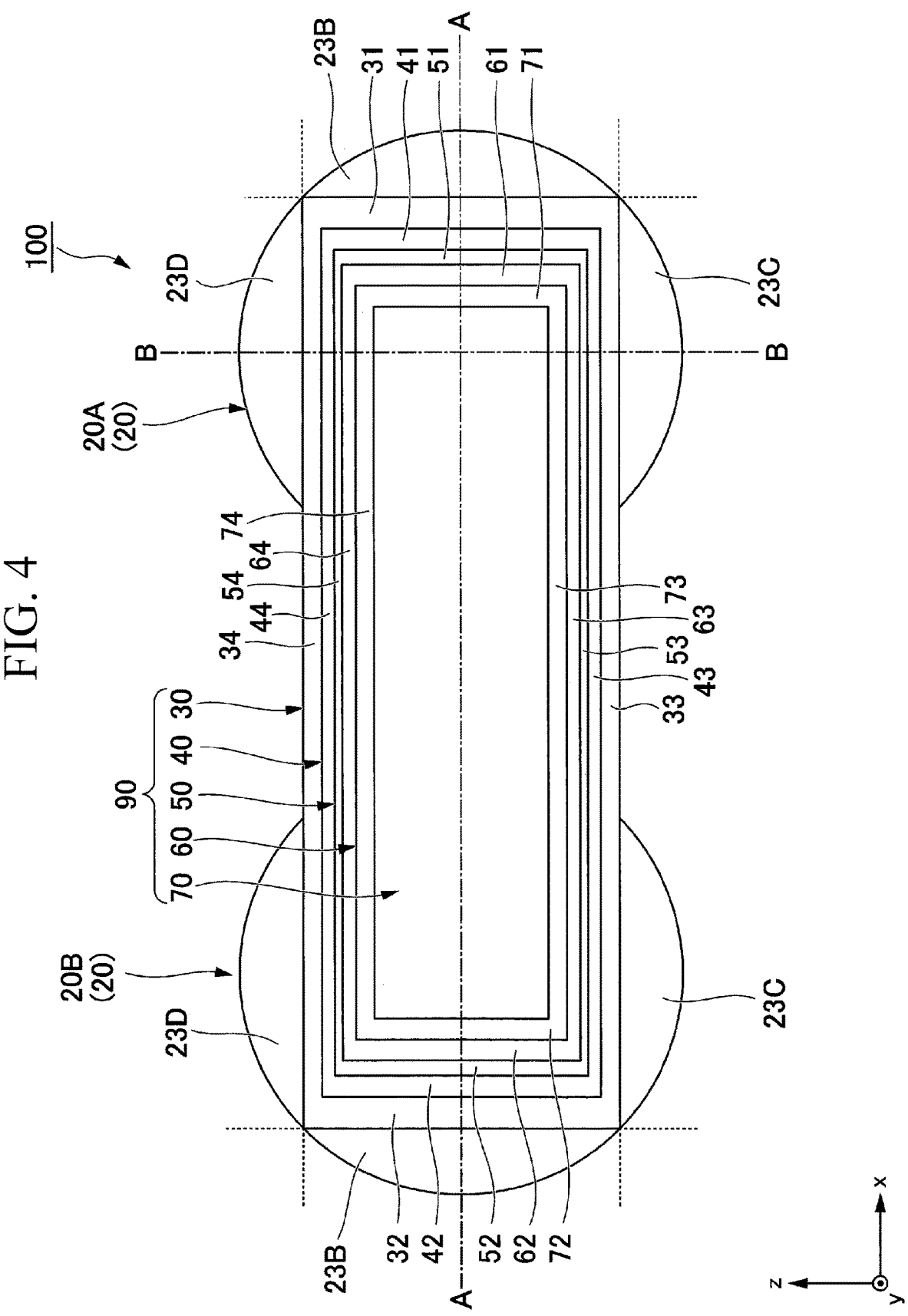
FIG. 4 is a plan view of the spin-orbit torque magnetoresistance effect element according to the first embodiment.

FIG. 1 is a perspective view of a spin-orbit torque magnetoresistance effect element according to a first embodiment. FIG. 2 is a cross-sectional view of the spin-orbit torque magnetoresistance effect element according to the first embodiment. FIG. 3 is a cross-sectional view in another cut plane of the spin-orbit torque magnetoresistance effect element according to the first embodiment. FIG. 4 is a plan view in another cut plane of the spin-orbit torque magnetoresistance effect element according to the first embodiment. FIG. 2 is a cross-section cut along an xz plane (plane A-A of FIG. 4) passing through the center of the spin-orbit torque wiring 30 to be described later in the y direction. FIG. 3 is a cross-section cut along an yz plane (plane B-B of FIG. 4) passing through an overlapping position between an element part 90 to be described later and a first conductive portion 20A to be described later.

A spin-orbit torque magnetoresistance effect element 100 includes a first insulating layer 10, two conductive portions 20, a spin-orbit torque wiring 30, a first ferromagnetic layer 40, a non-magnetic layer 50, a second ferromagnetic layer 60, a cap layer 70, and a second insulating layer 80. The spin-orbit torque wiring 30, the first ferromagnetic layer 40, the non-magnetic layer 50, the second ferromagnetic layer 60, and the cap layer 70 are referred to as the element part 90. In the conductive portions 20, for convenience of description, one of them is referred to as a first conductive portion 20A and the other of them is referred to as a second conductive portion 20B.

<First Insulating Layer>

The first insulating layer 10 is an interlayer insulating film that insulates between the wirings of the multilayer wiring and between the elements. The first insulating layer 10 electrically separates the element part 90 and a semiconductor element (for example, a transistor Tr shown in FIG. 5) except for the conductive portion 20. The first insulating layer 10 is made of, for example, silicon oxide ($SiO_x$), silicon nitride ($SiN_x$), silicon carbide (SiC), chromium nitride (CrN), silicon nitride (SiCN), silicon oxynitride (SiON), aluminum oxide ($Al_2O_3$), zirconium oxide ($ZrO_x$), or the like.

The first insulating layer 10 includes a first opening H1 and a second opening H2. The first opening H1 and the second opening H2 extend in the z direction. For example, the first opening H1 and the second opening H2 penetrate the first insulating layer 10 in the z direction.

<Conductive Portion>

Two conductive portions 20 are located inside the first insulating layer 10.

Two conductive portions 20 respectively arranged to be separated from each other in the x direction. The first conductive portion 20A is formed inside the first opening H1 of the first insulating layer 10. The second conductive portion 20B is formed inside the second opening H2 of the first insulating layer 10. Two conductive portions 20 electrically connect the element part 90 and the semiconductor element (for example, the transistor Tr shown in FIG. 5).

Each of two conductive portions 20 includes a first surface 21, a second surface 22, and a side surface 23. The first surface 21 is a surface facing the spin-orbit torque wiring 30 at a position closer to the spin-orbit torque wiring 30 than the other surfaces. Here, "facing" refers to a relationship facing each other and another layer may be provided between two layers which are in contact with each other. The first surface 21 is connected to, for example, the spin-orbit torque wiring 30. The second surface 22 is a surface on the side opposite to the first surface 21. The side surface 23 is a surface connecting the first surface 21 and the second surface 22 to each other.

The side surface 23 of the conductive portion 20 shown in FIG. 1 includes a major surface 23A, a third surface 23B, a fourth surface 23C, and a fifth surface 23D (see FIGS. 3 and 4). The major surface 23A is continuous in the z direction. Each of the third surface 23B, the fourth surface 23C, and the fifth surface 23D is inclined or curved with respect to the major surface 23A and is not continuous to the major surface 23A. Here, "continuous" means that the inclination of the tangent line drawn along the side surface 23 changes continuously on the cut plane obtained by cutting the conductive portion 20 on the xz plane or the yz plane. Further, "discontinuous" means that the inclination of the tangent line drawn along the side surface 23 does not continuously change on the cut plane obtained by cutting the conductive portion 20 on the xz plane or the yz plane. For example, when two continuous surfaces are connected via an inflection point, it is "discontinuous". The side surface 23 is bent at the boundary between the major surface 23A and the third surface 23B, the fourth surface 23C, or the fifth surface 23D. The third surface 23B, the fourth surface 23C, and the fifth surface 23D are, for example, parts formed by, for example, removing a part of the conductive portion 20.

In the xz cut plane shown in FIG. 2, the third surface 23B is inclined in the x direction with respect to the z direction. Further, in the xz cut plane, the third surface 23B is inclined in the x direction with respect to the major surface 23A. In the xz plane, the side surface 23 is bent at the boundary between the major surface 23A and the third surface 23B. In the yz cut plane shown in FIG. 3, the fourth surface 23C and the fifth surface 23D are inclined in the y direction with respect to the z direction. Further, in the yz cut plane, the fourth surface 23C and the fifth surface 23D are inclined in the y direction with respect to the major surface 23A. In the yz plane, the side surface 23 is bent at the boundary between the major surface 23A and the fourth surface 23C and the boundary between the major surface 23A and the fifth surface 23D.

Each major surface 23A of the conductive portion 20 includes a first side surface 23a and a second side surface 23b shown in FIG. 2 in the xz cut plane. The first side surface 23a is located at a position close to another conductive portion 20 in the xz cut plane. For example, the first side surface 23a of the first conductive portion 20A is a surface close to the second conductive portion 20B. The second side surface 23b is located on the side opposite to the first side surface 23a. The first side surface 23a and the second side surface 23b have different lengths in the z direction. The first side surface 23a, the second side surface 23b, and the third surface 23B are not line-symmetric with respect to the central axis of the conductive portion 20 in the x direction.

The conductive portion 20 contains a highly conductive material. The conductive portion 20 is made of, for example, copper, aluminum, silver, a conductive oxide film, a conductive nitride film, or the like.

The Vickers hardness difference between the first insulating layer 10 and the conductive portion 20 is preferably 3 GPa or less. The spin-orbit torque wiring 30 is laminated on the first insulating layer 10 and the conductive portion 20. The lamination surface of the spin-orbit torque wiring 30 of the first insulating layer 10 and the conductive portion 20 is preferably flat. When the Vickers hardness difference between the first insulating layer 10 and the conductive portion 20 is 3 GPa or less, the lamination surface is easily flattened by chemical mechanical polishing (CMP) or the like.

The following combinations can be considered as specific combinations in which the Vickers hardness difference between the first insulating layer 10 and the conductive portion 20 is 3 GPa or less.

For example, when the first insulating layer 10 is silicon oxide, vanadium nitride can be used for the conductive portion 20.

Further, for example, when the first insulating layer 10 is zirconium oxide, a nitride containing any one selected from a group consisting of Nb, V, and Al can be used for the conductive portion 20.

Further, for example, when the first insulating layer 10 is silicon nitride, a nitride containing any one selected from a group consisting of Nb, Zr, and Al can be used for the conductive portion 20.

Further, for example, when the first insulating layer 10 is any one of chromium nitride, silicon mononitride, and aluminum oxide, a nitride containing Ti or Zr can be used in the conductive portion 20.

<Spin-Orbit Torque Wiring>

The spin-orbit torque wiring 30 is located in the z direction of the first insulating layer 10. The spin-orbit torque wiring 30 extends in the x direction along two conductive portions 20 when viewed from the z direction.

When a potential difference is applied to both ends of the spin-orbit torque wiring 30, a current I flows along the spin-orbit torque wiring 30. A first spin s1 oriented in one direction and a second spin s2 oriented in the direction opposite to the first spin s1 are respectively bent in a direction orthogonal to the current. For example, the first spin s1 oriented in the +y direction is bent in the +z direction and the second spin s2 oriented in the −y direction is bent in the −z direction.

The normal Hall effect and the spin Hall effect are the same in that a movement (traveling) direction of moving (traveling) charges (electrons) is bent. On the other hand, the normal Hall effect and the spin Hall effect greatly differ in that, in the normal Hall effect, charged particles moving in a magnetic field are subjected to a Lorentz force and a moving direction of the spins is bent, whereas in the spin Hall effect, a moving direction of charged particles is bent only due to moving electrons (only due to a flowing current) even though a magnetic field is absent.

In a non-magnetic material (a material that is not a ferromagnet), the number of electrons in the first spin s1 and the number of electrons in the second spin s2 generated by the spin Hall effect are equal to each other. In FIG. 2, the number of electrons of the first spin s1 facing the +z direction is equal to the number of electrons of the second spin s2 facing the −z direction. In this case, the charge flows cancel each other out and the amount of current becomes zero. A spin current without a current is particularly called a pure spin current.

If the electron flow of the first spin s1 is $J_\uparrow$, the electron flow of the second spin s2 is $J_\downarrow$, and the spin current is $J_S$, it is defined as $J_S = J_\uparrow - J_\downarrow$. The spin current $J_S$ is generated in the z direction. In FIG. 1, the spin-orbit torque wiring 30 faces the first ferromagnetic layer 40. The spin is injected from the spin-orbit torque wiring 30 into the first ferromagnetic layer 40. The injected spins add spin-orbit torque (SOT) to the magnetization of the first ferromagnetic layer 40. The magnetization of the first ferromagnetic layer 40 is reversed by the spin-orbit torque (SOT).

The spin-orbit torque wiring 30 is made of any one of a metal, an alloy, an intermetallic compound, a metal boride, a metal carbide, a metal silicate, and a metal phosphate having a function of generating a spin current by the spin Hall effect when a current flows. The spin-orbit torque wiring 30 contains a material that produces spin-orbit torque (SOT) in the first ferromagnetic layer 40 that can reverse the magnetization of the first ferromagnetic layer 40.

The main configuration of the spin-orbit torque wiring 30 is preferably a non-magnetic heavy metal. The heavy metal means a metal having a specific gravity equal to or higher than that of yttrium. The non-magnetic heavy metal is preferably a non-magnetic metal having d-electrons or f-electrons on an outermost shell and having a large atomic number equal to or larger than an atomic number of 39. The non-magnetic heavy metal has a large spin-orbit interaction that causes the Spin Hall effect.

Electrons generally move in a direction opposite to the current regardless of the direction of the spin. In contrast, a non-magnetic metal having a d-electron or an f-electron in the outermost shell and having a large atomic number has a large spin-orbit interaction and a strong spin Hall effect. The flow of spins in the z direction depends on the degree of uneven distribution of spins in the z direction. When the spin Hall effect is strongly generated, spins are likely to be unevenly distributed and the spin current $J_S$ is likely to occur.

The spin-orbit torque wiring 30 may contain a magnetic metal. The magnetic metal is a ferromagnetic metal or an antiferromagnetic metal. A small amount of the magnetic metal contained in the non-magnetic material becomes a scattering factor of spins. Scattering of spins enhances spin-orbit interaction and increases the efficiency of spin current generation with respect to a current. The main configuration of the spin-orbit torque wiring 30 may consist only of an antiferromagnetic metal.

On the other hand, when the magnetic metal addition amount is too large, a generated spin current may be scattered by the added magnetic metal. As a result, there is concern that the spin current may decrease. The molar ratio of the added magnetic metal is preferably sufficiently smaller than the total molar ratio of the elements constituting the spin-orbit torque wiring. The molar ratio of the added magnetic metal is preferably 3% or less of the total molar ratio.

The spin-orbit torque wiring 30 may include a topological insulator. The topological insulator is a substance in which the inside of the substance is an insulator or a high resistance body, but is in a metallic state in which spin polarization occurs on the surface thereof. In the topological insulator, an internal magnetic field is generated by spin-orbit interaction. In the topological insulator, a new tropical phase due to the effect of spin-orbit interaction appears even when there is no external magnetic field. The topological insulator can highly efficiently generate pure spin current due to strong spin-orbit interaction and breakage of inversion symmetry at the edges.

Examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. The topological insulator can generate spin currents with high efficiency.

The spin-orbit torque wiring 30 includes a first side surface 31 and a second side surface 32 which are provided in the x direction and includes a third side surface 33 and a fourth side surface 34 which are provided in the y direction. The first side surface 31 and the second side surface 32 are inclined, for example, at an inclination angle θ1 in the x direction with respect to the z direction. The third side surface 33 and the fourth side surface 34 are inclined, for example, at an inclination angle θ2 in the y direction with respect to the z direction. The inclination angle θ1 is larger than, for example, the inclination angle θ2. The inclination angle θ1 is, for example, 45° or more, preferably 50° or more, and more preferably 60° or more. The inclination angle θ2 is, for example, 10° or more, preferably 20° or more, and more preferably 30° or more.

The first side surface 31 is continuous to, for example, the third surface 23B of the first conductive portion 20A and the second side surface 32 is continuous to, for example, the third surface 23B of the second conductive portion 20B. A third side surface 33 is continuous to the fourth surface 23C of the first conductive portion 20A and the second conductive portion 20B. A fourth side surface 34 is continuous to the fifth surface 23D of the first conductive portion 20A and the second conductive portion 20B.

Here, a "plurality of surfaces are continuous" means that there is substantially no deviation (step) between the two surfaces. That is, "continuous" means that one fitting line (straight line or curve) along two planes can be drawn on the cut plane cut in the xz plane or the yz plane. For example, unevenness of 10% or less of the thickness of the spin-orbit torque wiring 30 is regarded as an error.

<First Ferromagnetic Layer>

The first ferromagnetic layer 40 is located on the side opposite to the first insulating layer 10 (the +z direction) in the spin-orbit torque wiring 30.

The first ferromagnetic layer 40 contains a ferromagnetic material, particularly a soft magnetic material. The ferromagnetic material is, for example, a metal selected from a group consisting of Cr, Mn, Co, Fe, and Ni, an alloy containing one or more of these metals, an alloy containing these metals and at least one or more elements of B, C, and N, and the like. The ferromagnetic material is, for example, Co—Fe, Co—Fe—B, Ni—Fe, Co—Ho alloy, Sm—Fe alloy, Fe—Pt alloy, Co—Pt alloy, or CoCrPt alloy.

The first ferromagnetic layer 40 may contain a Heusler alloy such as $Co_2FeSi$. The Heusler alloy contains intermetallic compounds with a chemical composition of XYZ or $X_2YZ$. X is a transition metal element or noble metal element of Co, Fe, Ni, or Cu group on the periodic table, Y is a transition metal of Mn, V, Cr or Ti group or an elemental species of X, and Z is a typical element of groups III to V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. The Heusler alloy has high spin polarizability.

The first ferromagnetic layer 40 has an axis of easy magnetization in any direction in the xy plane or the z direction. When the first ferromagnetic layer 40 has an axis of easy magnetization in any direction in the xy plane, the first ferromagnetic layer 40 is referred to as an in-plane magnetic film. When the first ferromagnetic layer 40 has an axis of easy magnetization in the z direction, the first ferromagnetic layer 40 is referred to as a perpendicular magnetic film.

The first ferromagnetic layer 40 includes a first side surface 41 and a second side surface 42 in the x direction and includes a third side surface 43 and a fourth side surface 44 in the y direction. The first side surface 41 is continuous to the first side surface 31 and the third surface 23B. The second side surface 42 is continuous to the second side surface 32 and the third surface 23B. The third side surface 43 is continuous to the third side surface 33 and the fourth surface 23C. The fourth side surface 44 is continuous to the fourth side surface 34 and the fifth surface 23D. The first side surface 41 and the second side surface 42 are inclined, for example, at an inclination angle θ1 in the x direction with respect to the z direction. The third side surface 43 and the fourth side surface 44 are inclined, for example, at an inclination angle 02 in the y direction with respect to the z direction.

For example, as shown in FIG. 4, the first ferromagnetic layer 40 overlaps a part of two conductive portions 20 when viewed from the z direction. When the first ferromagnetic layer 40 and the conductive portion 20 do not overlap each other when viewed from the z direction, an area obtained by adding each of the areas of the first ferromagnetic layer 40 and the conductive portion 20 is required for one spin-orbit torque magnetoresistance effect element 100. In contrast, when the conductive portion 20 and the first ferromagnetic layer 40 are partially overlap each other when viewed from the z direction, an area required for one element decreases by the non-overlapping area. That is, a plurality of elements can be integrated more efficiently.

<Non-Magnetic Layer>

The non-magnetic layer 50 is located in the z direction of the first ferromagnetic layer 40. The non-magnetic layer 50 is sandwiched between the first ferromagnetic layer 40 and the second ferromagnetic layer 60.

The non-magnetic layer 50 is made of a non-magnetic insulator, semiconductor, or metal.

The non-magnetic insulator is, for example, $Al_2O_3$, $SiO_2$, MgO, $MgAl_2O_4$, and a material in which some of these Al, Si, and Mg are replaced with Zn, Be, and the like. When the non-magnetic layer 50 is made of a non-magnetic insulator, the non-magnetic layer 50 is a tunnel barrier layer. MgO or $MgAl_2O_4$ can easily realize a coherent tunnel between the first ferromagnetic layer 40 and the second ferromagnetic layer 60. The non-magnetic metal is, for example, Cu, Au, Ag, or the like. Further, the non-magnetic semiconductor is, for example, Si, Ge, $CuInSe_2$, $CuGaSe_2$, Cu (In, Ga) $Se_2$, or the like.

The non-magnetic layer 50 includes a first side surface 51 and a second side surface 52 in the x direction and includes a third side surface 53 and a fourth side surface 54 in the y direction. The first side surface 51 is continuous to the first side surfaces 31 and 41 and the third surface 23B. The second side surface 52 is continuous to the second side surfaces 32 and 42 and the third surface 23B. The third side surface 53 is continuous to the third side surfaces 33 and 43 and the fourth surface 23C. The fourth side surface 54 is continuous to the fourth side surfaces 34 and 44 and the fifth surface 23D. The first side surface 51 and the second side surface 52 are inclined, for example, at an inclination angle θ1 in the x direction with respect to the z direction. The third side surface 53 and the fourth side surface 54 are inclined, for example, at an inclination angle θ2 in the y direction with respect to the z direction.

<Second Ferromagnetic Layer>

The second ferromagnetic layer 60 is located on the side opposite to the first ferromagnetic layer 40 (the +z direction) in the non-magnetic layer 50. The second ferromagnetic layer 60 contains a ferromagnetic material. The second ferromagnetic layer 60 can use, for example, the same material as that of the first ferromagnetic layer 40. The coercivity of the second ferromagnetic layer 60 is larger than the coercivity of the first ferromagnetic layer 40. When the element part 90 is a coercive force difference type (pseudo spin valve type) magnetoresistance effect element, the coercivity of the second ferromagnetic layer 60 is set to be larger than the coercivity of the first ferromagnetic layer 40. When the element part 90 is an exchange bias type (spin valve type) magnetoresistance effect element, the second ferromagnetic layer 60 is made into an interlayer antiferromagnetic (SAF) bond and the magnetization of the second ferromagnetic layer 60 is fixed with respect to the first ferromagnetic layer 40.

The second ferromagnetic layer 60 includes a first side surface 61 and a second side surface 62 which are provided in the x direction and a third side surface 63 and a fourth side surface 64 which are provided in the y direction. The first side surface 61 is continuous to the first side surfaces 31, 41, and 51 and the third surface 23B. The second side surface 62 is continuous to the second side surfaces 32, 42, and 52 and the third surface 23B. The third side surface 63 is continuous to the third side surfaces 33, 43, and 53 and the fourth surface 23C. The fourth side surface 64 is continuous to the fourth side surfaces 34, 44, and 54 and the fifth surface 23D. The first side surface 61 and the second side surface 62 are inclined, for example, at an inclination angle θ1 in the x direction with respect to the z direction. The third side surface 63 and the fourth side surface 64 are inclined, for example, at an inclination angle θ2 in the y direction with respect to the z direction.

<Cap Layer>

The cap layer 70 is located in the z direction of the second ferromagnetic layer 60. The cap layer 70 suppresses the diffusion of elements from the second ferromagnetic layer 60 and influences the crystal orientation of each layer of the element part 90. The cap layer 70 stabilizes the magnetization of the first ferromagnetic layer 40 and the second ferromagnetic layer 60.

The cap layer 70 contains, for example, Ru, Ta, Cu, Ag, Au, and the like which are excellent in conductivity.

The cap layer 70 includes a first side surface 71 and a second side surface 72 which are provided in the x direction and includes a third side surface 73 and a fourth side surface 74 which are provided in the y direction. The first side surface 71 is continuous to the first side surfaces 31, 41, 51, and 61 and the third surface 23B. The second side surface 72 is continuous to the second side surfaces 32, 42, 52, and 62 and the third surface 23B. The third side surface 73 is continuous to the third side surfaces 33, 43, 53, and 63 and the fourth surface 23C. The fourth side surface 74 is continuous to the fourth side surfaces 34, 44, 54, and 64 and the fifth surface 23D. The first side surface 71 and the second side surface 72 are inclined, for example, at an inclination angle θ1 in the x direction with respect to the z direction. The third side surface 73 and the fourth side surface 74 are inclined, for example, at an inclination angle θ2 in the y direction with respect to the z direction.

<Second Insulating Layer>

The second insulating layer 80 is an insulating film that covers a part of the conductive portion 20 and the periphery of the element part 90. The second insulating layer 80 contains the same material as that of the first insulating layer 10. The second insulating layer 80 and the first insulating layer 10 may be made of the same material.

<Manufacturing Method>

The spin-orbit torque magnetoresistance effect element 100 is manufactured, for example, according to the following procedure. First, the first insulating layer 10 is laminated, for example, on a semiconductor substrate. The first insulating layer 10 is laminated by, for example, a sputtering method, a chemical vapor deposition (CVD) method, or the like.

Next, a first opening H1 and a second opening H2 are formed in the first insulating layer 10. A conductor is filled into the first opening H1 and the second opening H2 to form the conductive portion 20. The first opening H1 and the second opening H2 are formed by, for example, photolithography or the like. Next, one surface of the first insulating layer 10 and the conductive portion 20 is flattened by, for example, chemical mechanical polishing (CMP).

The spin-orbit torque wiring 30, the first ferromagnetic layer 40, the non-magnetic layer 50, the second ferromagnetic layer 60, and the cap layer 70 are sequentially laminated on the flattened one surface of the first insulating layer 10 and the conductive portion 20.

Next, the spin-orbit torque wiring 30, the first ferromagnetic layer 40, the non-magnetic layer 50, the second ferromagnetic layer 60, and the cap layer 70 are processed into a predetermined shape. These layers are processed by etching, ion milling, or the like. A part of the conductive portion 20 is removed when processing the spin-orbit torque wiring 30, the first ferromagnetic layer 40, the non-magnetic layer 50, the second ferromagnetic layer 60, and the cap layer 70 into a predetermined shape. The removed part becomes the third surface 23B, the fourth surface 23C, and the fifth surface 23D of the conductive portion 20. The spin-orbit torque wiring 30, the first ferromagnetic layer 40, the non-magnetic layer 50, the second ferromagnetic layer 60, and the cap layer 70 which are processed into a predetermined shape become the element part 90.

When processing the element part 90, for example, there is a case that a part of the conductive portion 20 or the spin-orbit torque wiring 30 may be scattered as impurities to the side walls of the first ferromagnetic layer 40 and the second ferromagnetic layer 60. Impurities deteriorate the magnetic properties of the first ferromagnetic layer 40 and the second ferromagnetic layer 60 so that a leak occurs between the first ferromagnetic layer 40 and the second ferromagnetic layer 60.

Impurities can be removed by the irradiation of an ion beam from the side (the x direction or the y direction). The ion beam is incident from an angle substantially parallel to the xy plane. An angle formed by the incident ion beam and the xy plane can be inclined to about 10°. When the side surfaces (the first side surfaces 41 and 61, the second side surfaces 42 and 62, the third side surfaces 43 and 63, and the fourth side surfaces 44 and 64) of the first ferromagnetic layer 40 and the second ferromagnetic layer 60 are inclined, it is easy to irradiate the side surfaces with the ion beam.

Further, the ion beam itself for removing impurities may be a source of impurities. For example, when the spin-orbit torque wiring 30 is irradiated with the ion beam, a part of the spin-orbit torque wiring 30 is scattered and becomes impurities. When the side surfaces of the first ferromagnetic layer 40 and the second ferromagnetic layer 60 are inclined, it is possible to prevent the orbit of impurities scattered by the ion beam from being disturbed by the side surfaces of the first ferromagnetic layer 40 and the second ferromagnetic layer 60 and to suppress the reattachment of impurities. Since the spin-orbit torque wiring 30 extends in the x direction, it is possible to further suppress the reattachment of impurities when the inclination angle θ1 is larger than the inclination angle θ2.

Finally, the second insulating layer 80 covers the periphery of the part exposed by removing a part of the element part 90 and the conductive portion 20 after processing and the spin-orbit torque magnetoresistance effect element 100 can be obtained.

Figure 5:
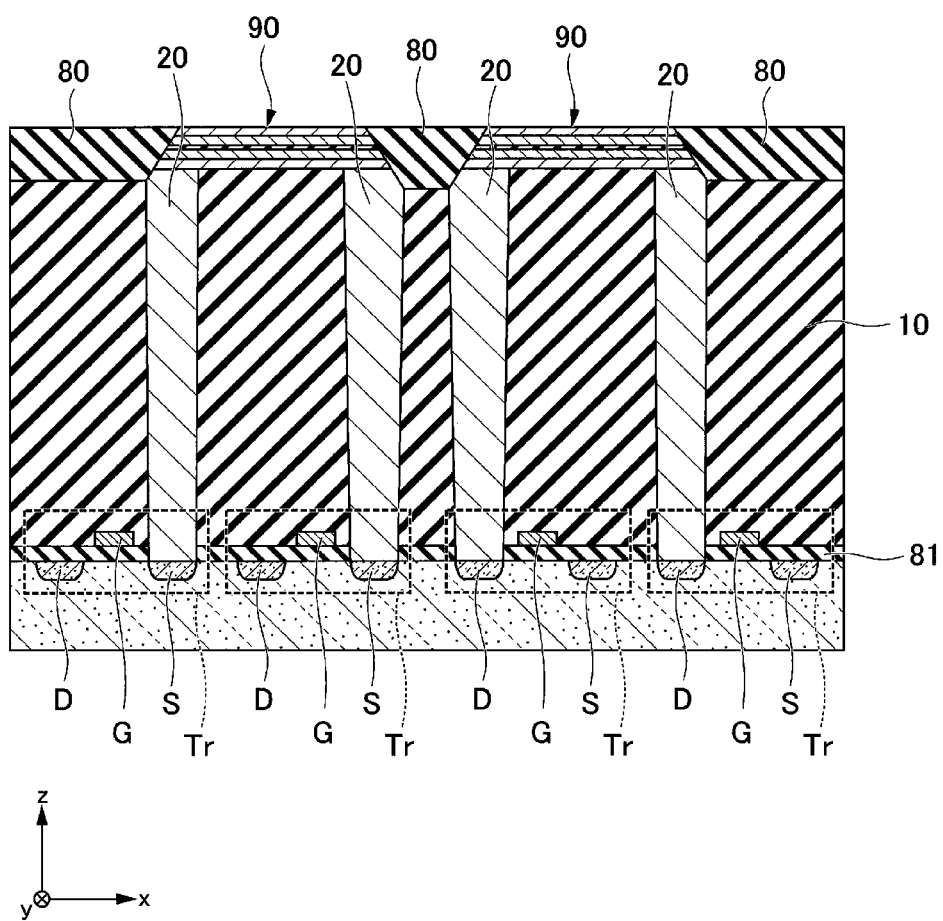
FIG. 5 is a cross-sectional view showing an arrangement of elements when there are a plurality of the spin-orbit torque magnetoresistance effect elements according to the first embodiment.

In the spin-orbit torque magnetoresistance effect element 100 according to the first embodiment, it is possible to improve the integration when integrating a plurality of elements. FIG. 5 is a cross-sectional view showing an example of the arrangement of the spin-orbit torque magnetoresistance effect element 100 when a plurality of the spin-orbit torque magnetoresistance effect elements 100 according to the first embodiment are provided.

The conductive portion 20 connects the transistor Tr and the element part 90. The transistor Tr is, for example, a field effect transistor in which a source S and a drain D are controlled by a gate electrode G via a gate insulating film 81.

The size of the conductive portion 20 in the xy plane is designed and can be changed freely. For example, the minimum processing dimension (feature size: F) in the current semiconductor is said to be 7 nm, and the width of the conductive portion 20 in the x direction and the y direction is 7 nm at the minimum. In other words, it is difficult to make the width of the conductive portion 20 in the x direction and the y direction smaller than this size and it is difficult to improve the integration by changing the area of the conductive portion 20. Further, the electrical influence of the electric field generated by the current flowing through the conductive portion 20 cannot be ignored. That is, the conductive portion 20 is one of the elements that influence the integration of the spin-orbit torque magnetoresistance effect element 100.

When the conductive portion 20 includes the third surface 23B, the width of the first surface 21 of the conductive portion 20 in the x direction is shortened. When the width of the conductive portion 20 in the x direction is shortened, the distance between the adjacent spin-orbit torque magnetoresistance effect elements 100 can be shortened by that amount due to the structure. Further, even when the electrical influence of the conductive portion 20 is taken into consideration, the distance between the adjacent spin-orbit torque magnetoresistance effect elements 100 can be shortened. Thus, according to the spin-orbit torque magnetoresistance effect element 100 of the first embodiment, it is possible to improve the integration when integrating a plurality of elements.

Further, in the spin-orbit torque magnetoresistance effect element 100 according to the first embodiment, the current (writing current) I can easily flow to the spin-orbit torque wiring 30. The writing current flows between two conductive portions 20 via the spin-orbit torque wiring 30. The electrical resistance R of the spin-orbit torque wiring 30 is represented by R=ρL/A. ρ is the electrical resistivity, L is the length in the x direction, and A is the area of the cross-section of the spin-orbit torque wiring 30 cut in the yz plane.

When the first side surface 31 and the second side surface 32 of the spin-orbit torque wiring 30 are inclined, the cross-sectional area of the spin-orbit torque wiring 30 in the yz plane gradually increases. That is, the electrical resistance R of the spin-orbit torque wiring 30 gradually changes in the x direction and the flow of the writing current becomes gentle. Further, the first side surface 31 of the spin-orbit torque wiring 30 is continuous to the first side surface 41 of the first ferromagnetic layer 40 and the second side surface 32 of the spin-orbit torque wiring 30 is continuous to the second side surface 42 of the first ferromagnetic layer 40. Since a part of the writing current also flows to the first ferromagnetic layer 40, the flow of the writing current becomes smooth when the side surface of the x direction is continuous. When the flow of the writing current becomes smooth, the generation of heat of the spin-orbit torque wiring 30 is suppressed.

As described above, an example of the spin-orbit torque magnetoresistance effect element 100 according to the first embodiment has been described, but the configuration can be added, omitted, replaced, and modified into other forms in the scope not departing from the gist of the present invention.

First Modified Example

Figure 6:
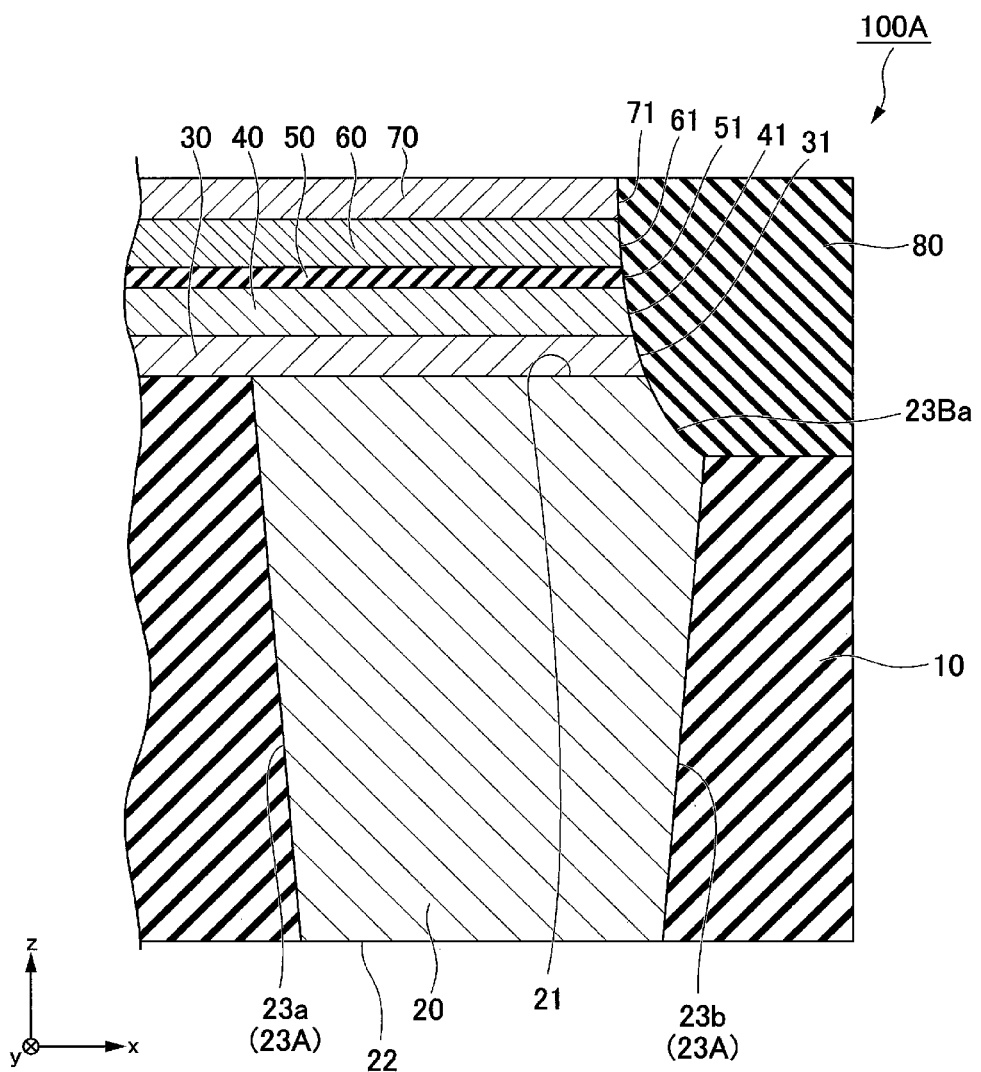
FIG. 6 is a cross-sectional view of a spin-orbit torque magnetoresistance effect element according to a first modified example.

FIG. 6 is a cross-sectional view of a spin-orbit torque magnetoresistance effect element according to a first modified example. FIG. 6 is an enlarged view of an end portion of a spin-orbit torque magnetoresistance effect element 100A in the x direction.

The same configurations as those of the spin-orbit torque magnetoresistance effect element 100 according to the first embodiment are designated by the same reference numerals and the description thereof will be omitted.

A third surface 23Ba of the conductive portion 20 shown in FIG. 6 is curved in the x direction with respect to the z direction. Further, the first side surfaces 31, 41, 51, 61, and 71 of the spin-orbit torque wiring 30, the first ferromagnetic layer 40, the non-magnetic layer 50, the second ferromagnetic layer 60, and the cap layer 70 are also curved in the x direction with respect to the z direction. The third surface 23Ba is continuous to the first side surfaces 31, 41, 51, 61, and 71.

Second Modified Example

Figure 7:
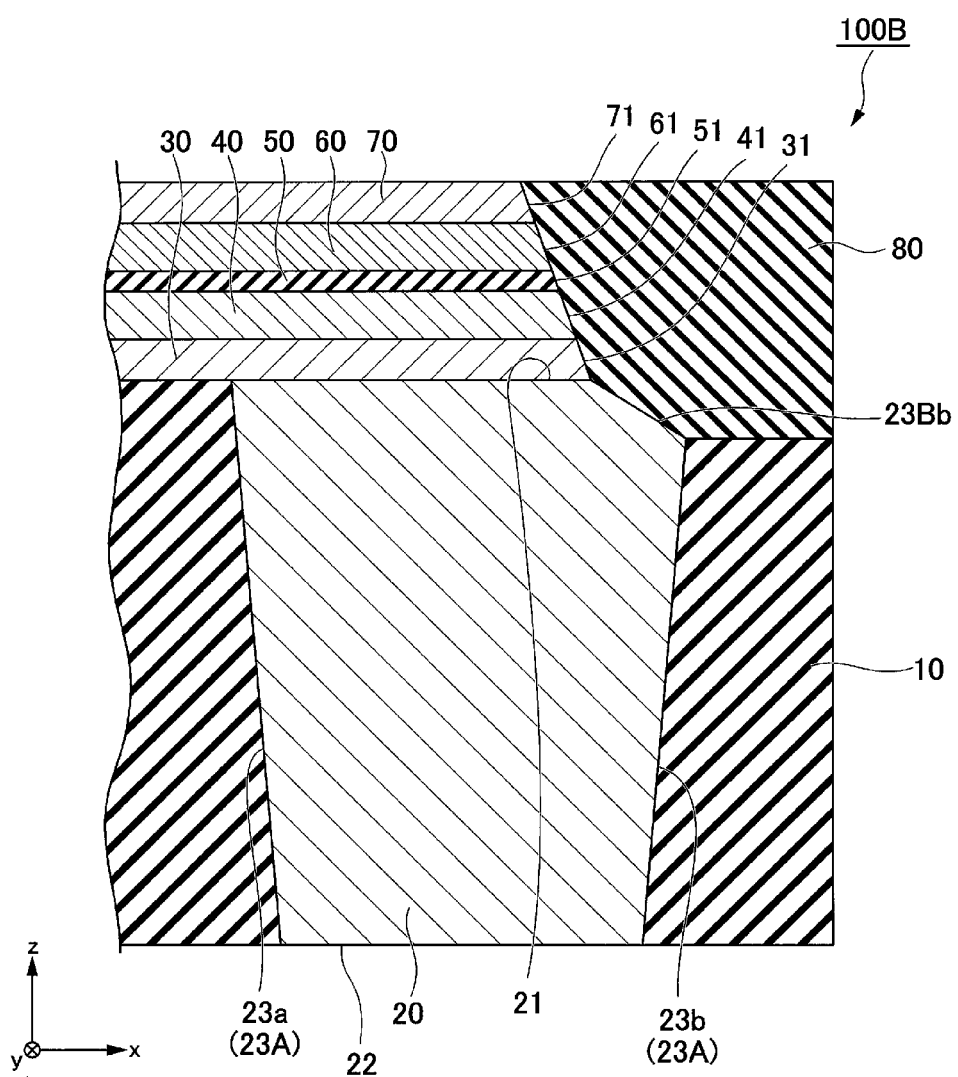
FIG. 7 is a cross-sectional view of a spin-orbit torque magnetoresistance effect element according to a second modified example.

FIG. 7 is a cross-sectional view of a spin-orbit torque magnetoresistance effect element according to a second modified example. FIG. 7 is an enlarged view of an end portion of a spin-orbit torque magnetoresistance effect element 100B in the x direction.

The same configurations as those of the spin-orbit torque magnetoresistance effect element 100 according to the first embodiment are designated by the same reference numerals and the description thereof will be omitted.

A third surface 23Bb of the conductive portion 20 shown in FIG. 7 is inclined in the x direction with respect to the z direction. Further, the first side surfaces 31, 41, 51, 61, and 71 of the spin-orbit torque wiring 30, the first ferromagnetic layer 40, the non-magnetic layer 50, the second ferromagnetic layer 60, and the cap layer 70 are also inclined in the x direction with respect to the z direction. An inclination angle of the third surface 23Bb with respect to the z direction is different from inclination angles of the first side surfaces 31, 41, 51, 61, and 71 with respect to the z direction. The third surface 23Ba is not continuous to the first side surfaces 31, 41, 51, 61, and 71. Due to a difference in etching rate between the element part 90 and the conductive portion 20, the inclination angle of the third surface 23Bb with respect to the z direction may be different from the inclination angles of the first side surfaces 31, 41, 51, 61, and 71 with respect to the z direction in some cases.

Third Modified Example

Figure 8:
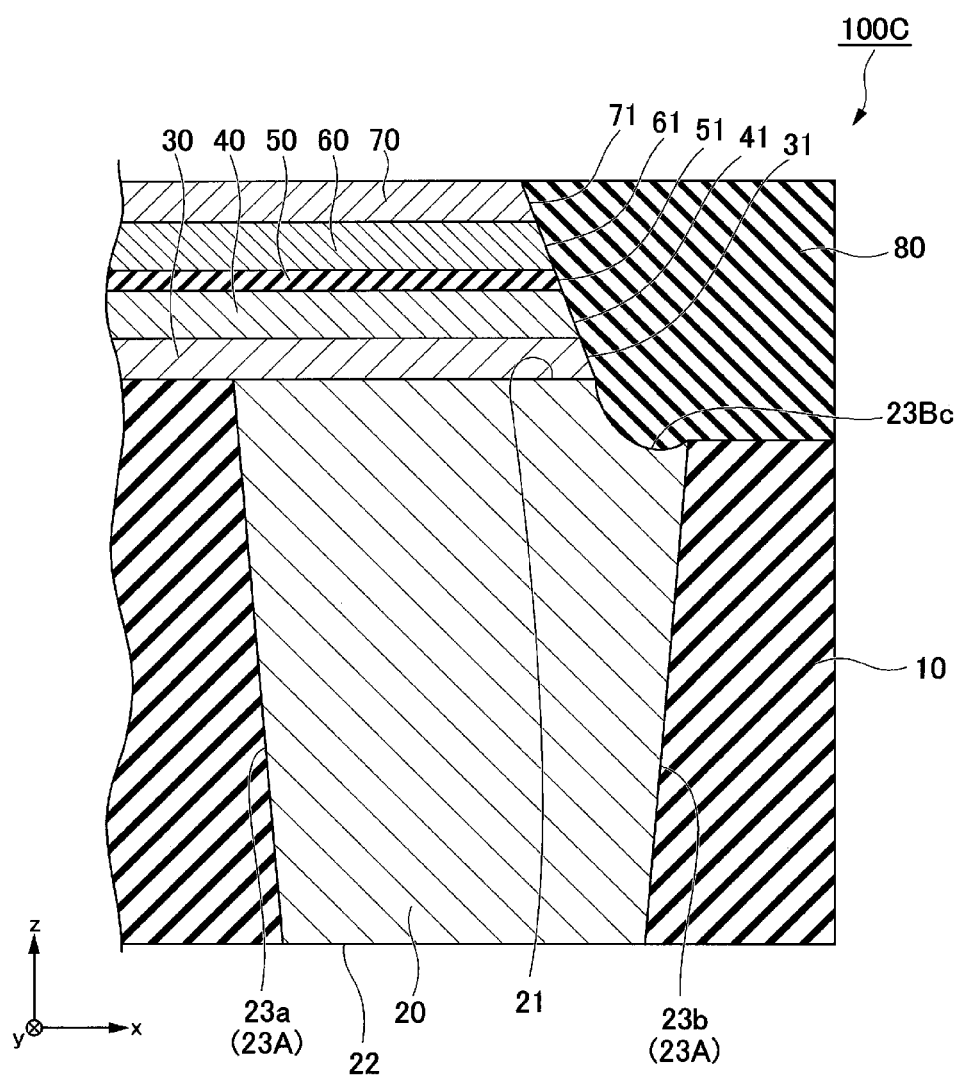
FIG. 8 is a cross-sectional view of a spin-orbit torque magnetoresistance effect element according to a third modified example.

FIG. 8 is a cross-sectional view of a spin-orbit torque magnetoresistance effect element according to a third modified example. FIG. 8 is an enlarged view of an end portion of a spin-orbit torque magnetoresistance effect element 100C in the x direction.

The same configurations as those of the spin-orbit torque magnetoresistance effect element 100 according to the first embodiment are designated by the same reference numerals and the description thereof will be omitted.

A third surface 23Bc of the conductive portion 20 shown in FIG. 8 is curved in the x direction with respect to the z direction. Further, the first side surfaces 31, 41, 51, 61, and 71 of the spin-orbit torque wiring 30, the first ferromagnetic layer 40, the non-magnetic layer 50, the second ferromagnetic layer 60, and the cap layer 70 are also inclined in the x direction with respect to the z direction. The third surface 23Bc is not continuous to the first side surfaces 31, 41, 51, 61, and 71. When the conductive portion 20 is more likely to be etched than the first insulating layer 10, a part of the conductive portion 20 may be gouged toward the inside of the element part 90 and the third surface 23Bc may be curved.

Fourth Modified Example

Figure 9:
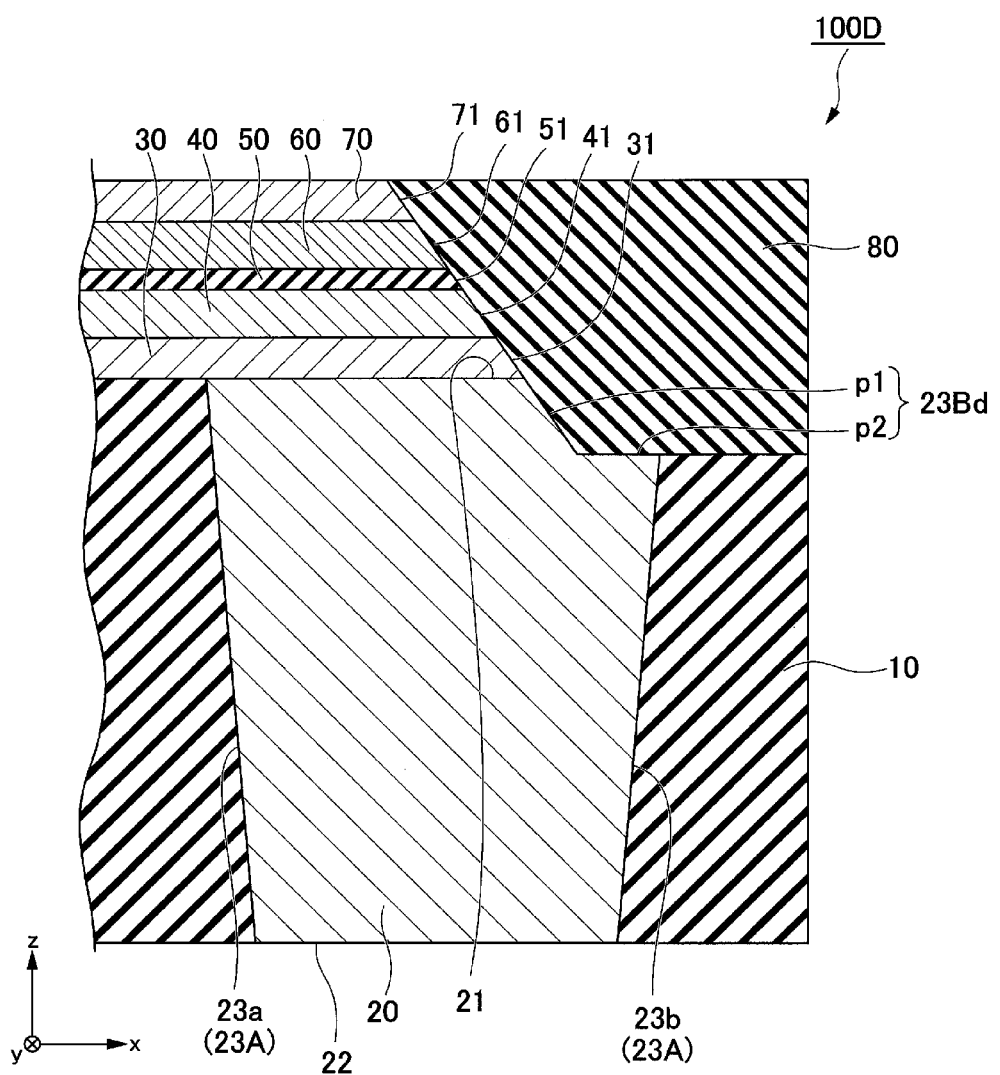
FIG. 9 is a cross-sectional view of a spin-orbit torque magnetoresistance effect element according to a fourth modified example.

FIG. 9 is a cross-sectional view of a spin-orbit torque magnetoresistance effect element according to a fourth modified example. FIG. 9 is an enlarged view of an end portion of a spin-orbit torque magnetoresistance effect element 100D in the x direction.

The same configurations as those of the spin-orbit torque magnetoresistance effect element 100 according to the first embodiment are designated by the same reference numerals and the description thereof will be omitted.

A third surface 23Bd of the conductive portion 20 shown in FIG. 9 includes a first part p1 and a second part p2. The first part p1 is inclined in the x direction with respect to the z direction. The second part p2 is inclined in the x direction with respect to the first part p1. The third surface 23Bd is bent at the boundary between the first part p1 and the second part p2. Further, the first side surfaces 31, 41, 51, 61, and 71 of the spin-orbit torque wiring 30, the first ferromagnetic layer 40, the non-magnetic layer 50, the second ferromagnetic layer 60, and the cap layer 70 are inclined with respect to the z direction. The first part p1 is continuous to the first side surfaces 31, 41, 51, 61, and 71 and the first part p1 is not continuous to the second part p2.

Fifth Modified Example

Figure 10:
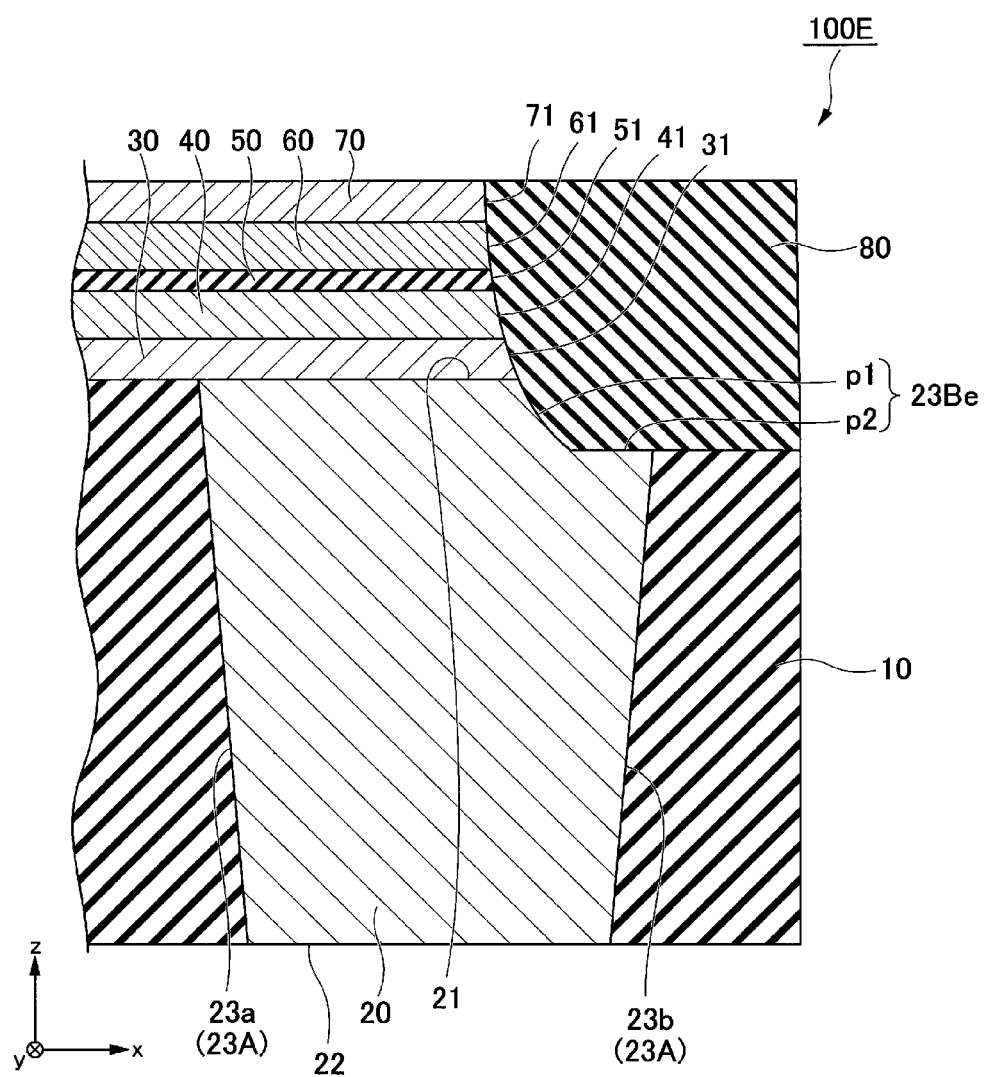
FIG. 10 is a cross-sectional view of a spin-orbit torque magnetoresistance effect element according to a fifth modified example.

FIG. 10 is a cross-sectional view of a spin-orbit torque magnetoresistance effect element according to a fifth modified example. FIG. 10 is an enlarged view of an end portion of a spin-orbit torque magnetoresistance effect element 100E in the x direction. The same configurations as those of the spin-orbit torque magnetoresistance effect element 100 according to the first embodiment are designated by the same reference numerals and the description thereof will be omitted.

A third surface 23Be of the conductive portion 20 shown in FIG. 10 includes a first part p1 and a second part p2. The first part p1 is curved in the x direction with respect to the z direction. The second part p2 is inclined in the x direction with respect to the first part p1. The third surface 23Be is bent at the boundary between the first part p1 and the second part p2. Further, the first side surfaces 31, 41, 51, 61, and 71 of the spin-orbit torque wiring 30, the first ferromagnetic layer 40, the non-magnetic layer 50, the second ferromagnetic layer 60, and the cap layer 70 are also curved with respect to the z direction. The first part p1 is continuous to the first side surfaces 31, 41, 51, 61, and 71 and the first part p1 is not continuous to the second part p2.

Sixth Modified Example

Figure 11:
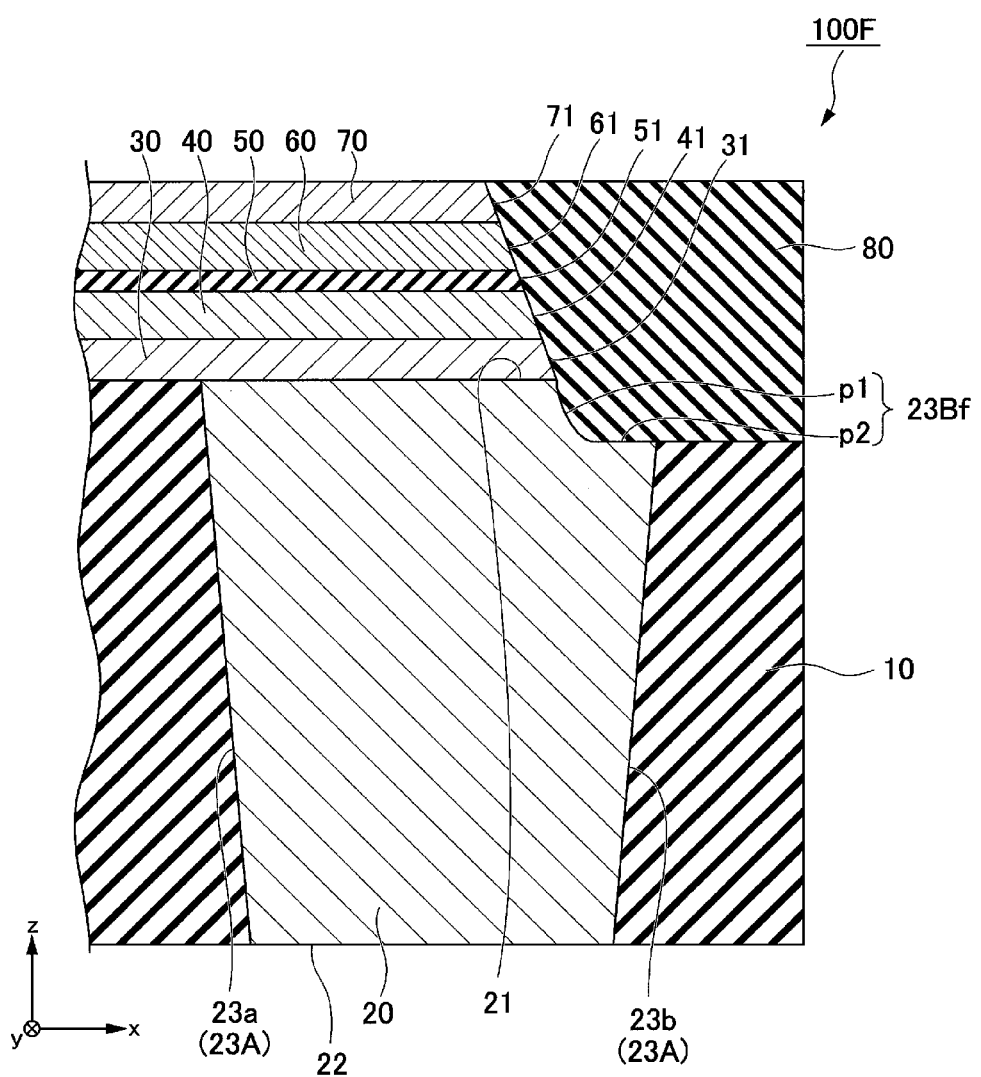
FIG. 11 is a cross-sectional view of a spin-orbit torque magnetoresistance effect element according to a sixth modified example.

FIG. 11 is a cross-sectional view of a spin-orbit torque magnetoresistance effect element according to a sixth modified example. FIG. 11 is an enlarged view of an end portion of a spin-orbit torque magnetoresistance effect element 100F in the x direction. The same configurations as those of the spin-orbit torque magnetoresistance effect element 100 according to the first embodiment are designated by the same reference numerals and the description thereof will be omitted.

A third surface 23Bf of the conductive portion 20 shown in FIG. 11 includes a first part p1 and a second part p2. The first part p1 is curved in the x direction with respect to the z direction. The first part p1 is gouged toward the inside of the spin-orbit torque wiring 30 when viewed from the z direction. The second part p2 is inclined in the x direction with respect to the first part. The third surface 23Bf is bent at the boundary between the first part p1 and the second part p2. Further, the first side surfaces 31, 41, 51, 61, and 71 of the spin-orbit torque wiring 30, the first ferromagnetic layer 40, the non-magnetic layer 50, the second ferromagnetic layer 60, and the cap layer 70 are inclined with respect to the z direction. The first part p1 and the second part p2 are not continuous to the first side surfaces 31, 41, 51, 61, and 71.

Seventh Modified Example

Figure 12:
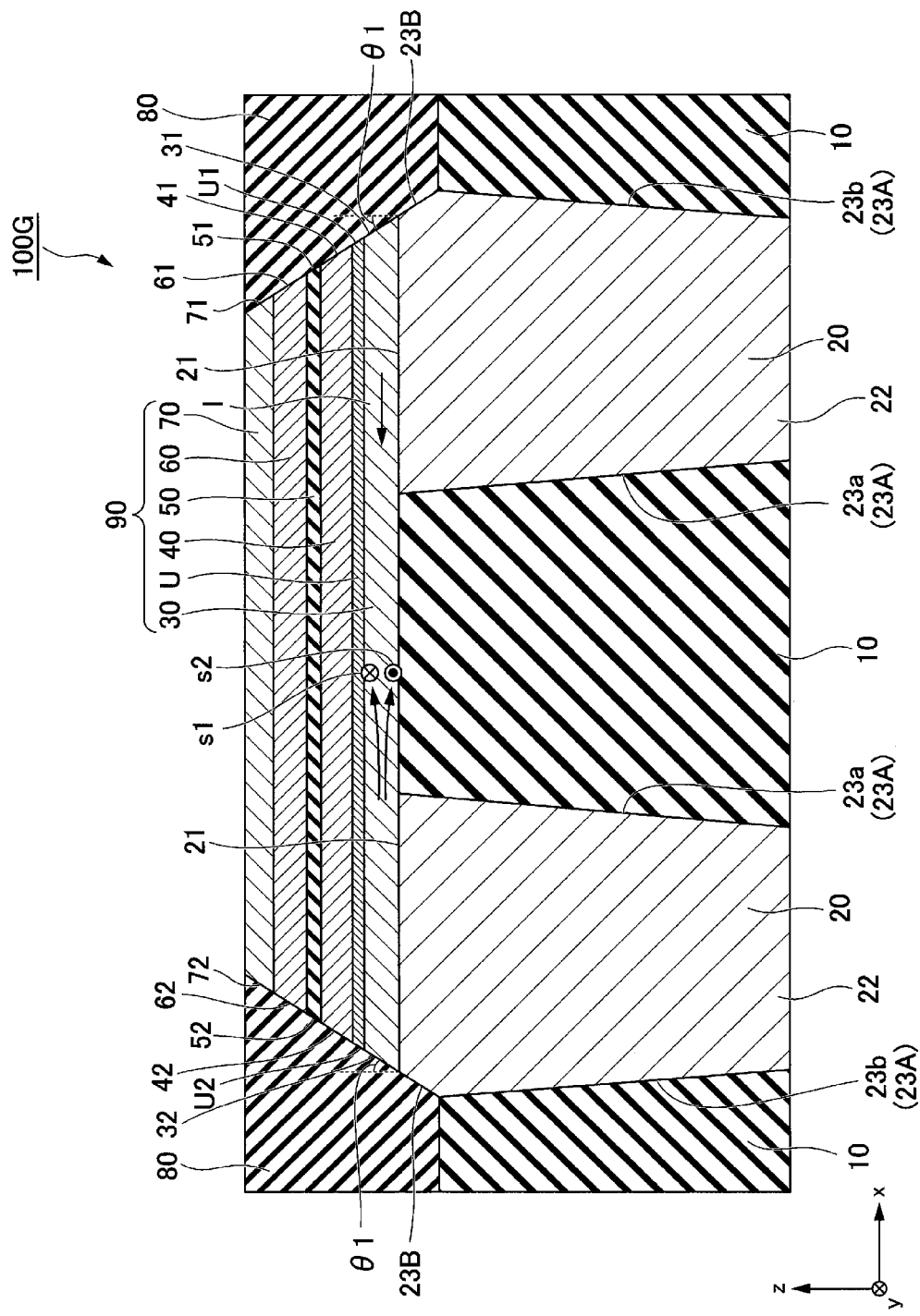
FIG. 12 is a cross-sectional view of a spin-orbit torque magnetoresistance effect element according to a seventh modified example.

FIG. 12 is a cross-sectional view of a spin-orbit torque magnetoresistance effect element according to a seventh modified example. The same configurations as those of the spin-orbit torque magnetoresistance effect element 100 according to the first embodiment are designated by the same reference numerals and the description thereof will be omitted.

A spin-orbit torque magnetoresistance effect element 100G shown in FIG. 12 is different from the spin-orbit torque magnetoresistance effect element 100 shown in FIG. 2 in that an underlayer U is provided. The underlayer U is located between the spin-orbit torque wiring 30 and the first ferromagnetic layer 40. A first side surface U1 of the underlayer U is continuous to the first side surfaces 31, 41, 51, 61, and 71 and the third surface 23B and a second side surface U2 of the underlayer U is continuous to the second side surfaces 32, 42, 52, 62, and 72 and the third surface 23B.

The underlayer U is a layer that alleviates the influence of the crystal lattice of the spin-orbit torque wiring 30 on the crystal growth of the first ferromagnetic layer 40. When the underlayer U is provided, the influence of the crystal structure of the spin-orbit torque wiring 30 on the first ferromagnetic layer 40 can be reduced and the crystal structure of the first ferromagnetic layer 40 can be easily designed. As a result, the axis of easy magnetization of the first ferromagnetic layer 40 can be easily set to an arbitrary direction. For example, when the axis of easy magnetization of the first ferromagnetic layer 40 is set to the z direction, data recording density increases. Further, when the axis of easy magnetization of the first ferromagnetic layer 40 is set to any direction in the xy plane, the data recording speed becomes fast.

For example, a metal or alloy containing one or more elements selected from a group consisting of Ti, Cr, Cu, Zn, Mg, Al, Si, B, and C can be used for the underlayer U. The underlayer U is preferably amorphous.

The underlayer U may be a plurality of layers. The underlayer U may include, for example, a magnetization control layer that controls the magnetization direction of the first ferromagnetic layer 40. The magnetization control layer is, for example, $SmFe_{12}$.

The crystal structure of the first ferromagnetic layer 40 is influenced by the magnetization control layer to match the crystal structure of the magnetization control layer. The first ferromagnetic layer 40 is laminated to maintain lattice matching properties with the magnetization control layer. When the crystal structure is tetragonal, the easy magnetization direction tends to be oriented in the c-axis direction. If the crystal structure of the magnetization control layer is a tetragonal crystal with the c-axis oriented in the xy plane, the magnetization control layer becomes an in-plane magnetic film and the first ferromagnetic layer 40 also becomes an in-plane magnetic film. The tetragonal crystal with the c-axis oriented in the xy plane can be made to grow the magnetization control layer while applying a magnetic field toward the inside of the xy plane.

All spin-orbit torque magnetoresistance effect elements according to the first modified example to the seventh modified example include the third surface which is not continuous to the side surface of the conductive portion 20. Thus, it is possible to obtain the same effect as that of the spin-orbit torque magnetoresistance effect element 100 according to the first embodiment.

So far, an example in which each of two conductive portions 20 includes the third surface 23B, the fourth surface 23C, and the fifth surface 23D has been described, but only one conductive portion 20 (the first conductive portion 20A) may include the third surface 23B, the fourth surface 23C, and the fifth surface 23D. Further, the conductive portion 20 may not include the fourth surface 23C and the fifth surface 23D.

Second Embodiment (Spin-Orbit Torque Magnetization Rotational Element)

Figure 13:
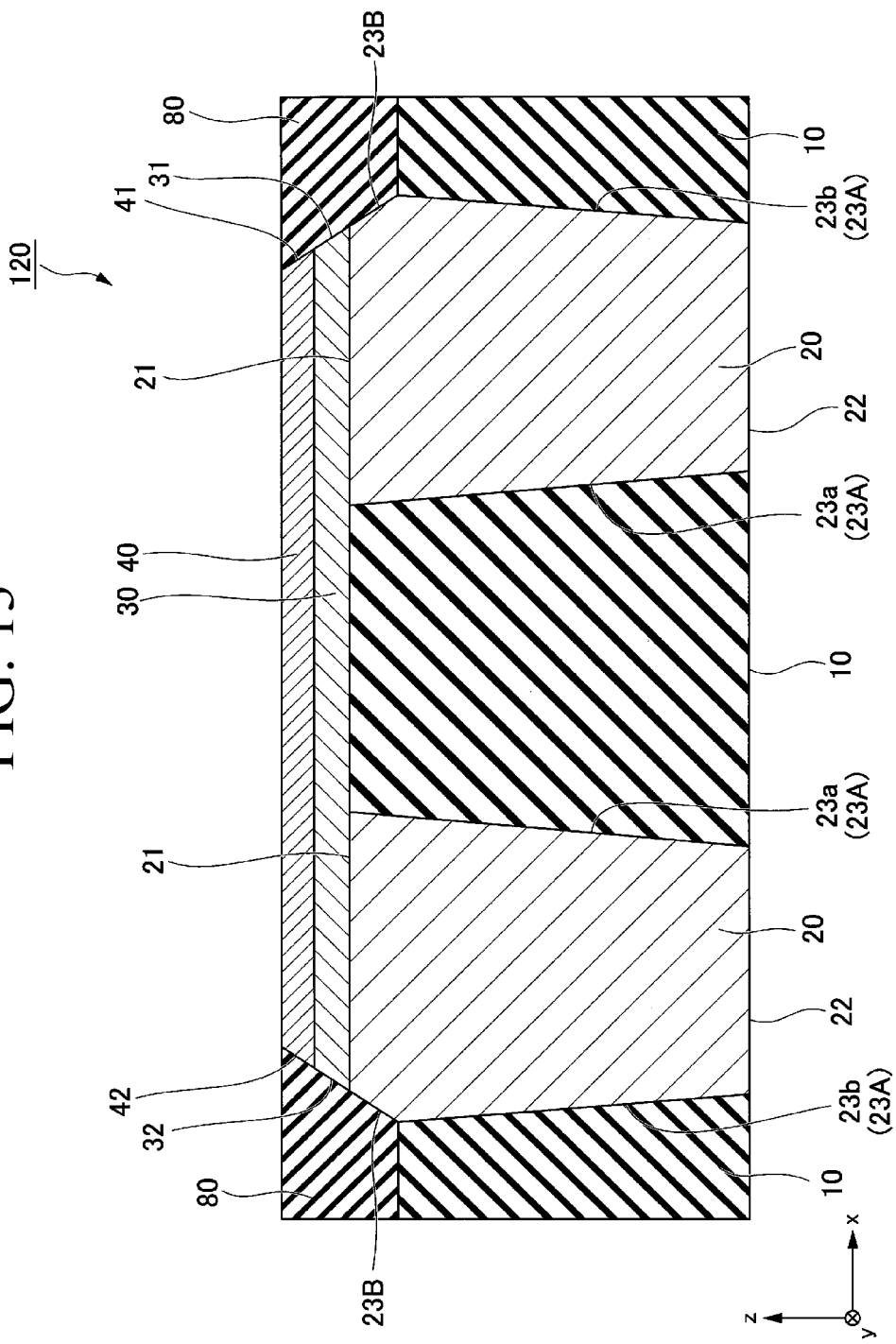
FIG. 13 is a cross-sectional view of a spin-orbit torque magnetization rotational element according to a second embodiment.

FIG. 13 is a cross-sectional view of a spin-orbit torque magnetization rotational element according to a second embodiment. A spin-orbit torque magnetization rotational element 120 shown in FIG. 13 is different from the spin-orbit torque magnetoresistance effect element 100 according to the first embodiment in that the non-magnetic layer 50, the second ferromagnetic layer 60, and the cap layer 70 are not provided.

The spin-orbit torque magnetization rotational element 120 can be used as the magnetoresistance effect element as described above. Further, the spin-orbit torque magnetization rotational element 120 can be used alone as an anisotropic magnetic sensor or an optical element using a magnetic Kerr effect or a magnetic Faraday effect. A spin current magnetization rotational element can be particularly referred to as a spin-current magnetization rotational element when the magnetization is reversed.

The spin-orbit torque magnetization rotational element 120 according to the second embodiment can improve the integration during integrating similarly to the above-described spin-orbit torque magnetoresistance effect element 100. Further, the spin-orbit torque magnetization rotational element 120 according to the second embodiment has a smooth flow of a writing current and can suppress the generation of heat. Further, the spin-orbit torque magnetization rotational element 120 according to the second embodiment can suppress the reattachment of impurities during processing and stabilizes the magnetic properties of the first ferromagnetic layer 40. Further, the spin-orbit torque magnetization rotational element 120 according to the second embodiment can select the same modified examples as those of the spin-orbit torque magnetoresistance effect element 100 according to the first embodiment.

Third Embodiment (Magnetic Memory)

Figure 14:
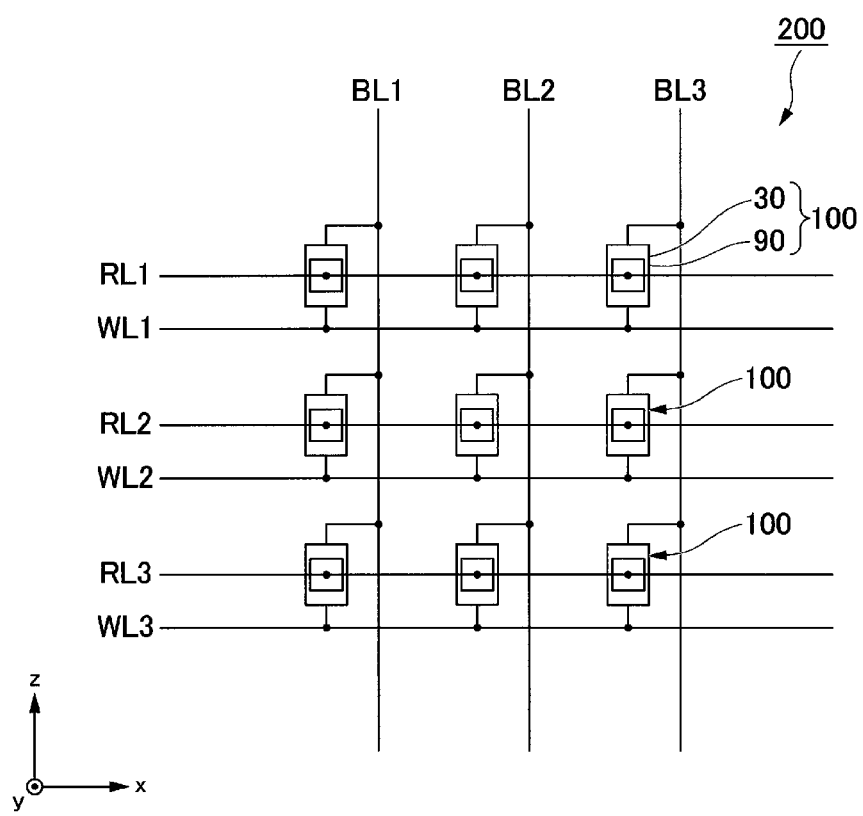
FIG. 14 is a circuit diagram of a magnetic memory according to a third embodiment.

FIG. 14 is a schematic diagram of a magnetic memory according to a third embodiment. A magnetic memory 200 includes the plurality of spin-orbit torque magnetoresistance effect elements 100 (see FIG. 11) and a wiring connecting these to each other.

In the magnetic memory 200 shown in FIG. 14, the spin-orbit torque magnetoresistance effect element 100 has a 3×3 matrix arrangement. FIG. 14 is an example of the magnetic memory and the number and the arrangement of the spin-orbit torque magnetoresistance effect elements 100 are arbitrary.

One word line WL1 to 3, one bit line BL1 to 3, and one read line RL1 to 3 are connected to the spin-orbit torque magnetoresistance effect element 100.

A writing operation is performed by selecting the word line WL1 to 3 and the bit line BL1 to 3 for applying a current thereto so that a current flows to the spin-orbit torque wiring 30 of an arbitrary spin-orbit torque magnetoresistance effect element 100. Further, a reading operation is performed by selecting the read line RL1 to 3 and the bit line BL1 to 3 for applying a current thereto so that a current flows in the lamination direction of the arbitrary spin-orbit torque magnetoresistance effect element 100. The word line WL1 to 3, the bit line BL1 to 3, and the read line RL1 to 3 for applying a current thereto can be selected by a transistor or the like. That is, the magnetic memory can be operated by reading data of an arbitrary element from the plurality of spin-orbit torque magnetoresistance effect elements 100.

Fourth Embodiment (Reservoir Element)

A reservoir element is an element used in a reservoir computer which is one of the neuromorphic elements. The neuromorphic element is an element that imitates a human brain by a neural network. The reservoir element includes a plurality of chips that interact with each other. The plurality of chips interact with each other by the input signals and outputs signals. The transmission means that connects multiple chips has a fixed weight and does not learn. The reservoir element is a part that compresses data and the compressed data is weighted in an output unit and improves a correct answer rate of a question. The reservoir computer is expected as one of means to simplify a circuit design of neuromorphic devices and improve power consumption.

Figure 15:
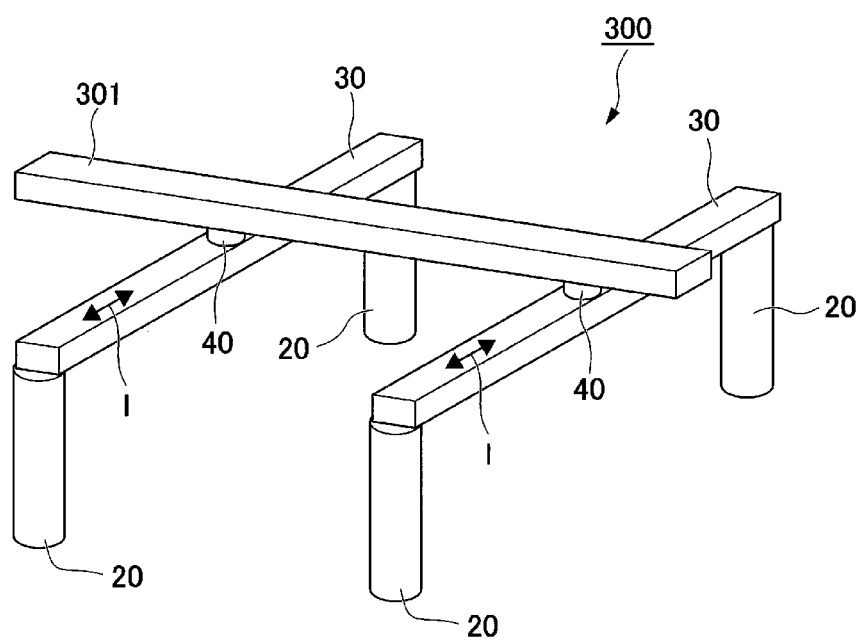
FIG. 15 is a perspective view of a reservoir element according to a fourth embodiment.

FIG. 15 is a perspective view of a reservoir element according to a fourth embodiment. A reservoir element 300 includes the conductive portion 20, the spin-orbit torque wiring 30, the first ferromagnetic layer 40, and a spin conductive layer 301. The combination of the conductive portion 20, the spin-orbit torque wiring 30, and the first ferromagnetic layer 40 corresponds to the spin-orbit torque magnetization rotational element 120 according to the second embodiment.

The spin conductive layer 301 connects, for example, a plurality of first ferromagnetic layers 40. The spin conductive layer 301 is made of, for example, a non-magnetic conductor. The spin conductive layer 301 propagates the spin current exuded from the first ferromagnetic layer 40.

The spin conductive layer 301 is, for example, a metal or semiconductor. The metal used in the spin conductive layer 301 is, for example, a metal or alloy containing any element selected from a group consisting of Cu, Ag, Al, Mg, and Zn. The semiconductor used in the spin conductive layer 301 is, for example, a single element selected from a group consisting of Si, Ge, GaAs, and C or an alloy. For example, Si, Ge, Si—Ge compound, GaAs, graphene, and the like can be exemplified.

When the current I flows through the spin-orbit torque wiring 30, spin is injected into the first ferromagnetic layer 40 and spin-orbit torque is added to the magnetization of the first ferromagnetic layer 40. When a high-frequency current is applied to the spin-orbit torque wiring 30, the direction of the spin injected to the first ferromagnetic layer 40 changes and the magnetization of the first ferromagnetic layer 40 vibrates.

The spin current flows from the first ferromagnetic layer 40 to the spin conductive layer 301. Since the magnetization of the first ferromagnetic layer 40 vibrates, the spin current flowing through the spin conductive layer 301 also vibrates to correspond to the magnetization. The spin accumulated at the interface between the first ferromagnetic layer 40 and the spin conductive layer 301 propagates in the spin conductive layer 301 as a spin current.

The spin currents produced by the magnetizations of the two first ferromagnetic layers 40 merge and interfere with each other in the spin conductive layer 301. The interference of the spin current influences the magnetization vibration of each first ferromagnetic layer 40 and the magnetization vibration of the two first ferromagnetic layers 40 resonates. The vibration phases of the two magnetizations are synchronized or shifted by half a wavelength (7).

When the application of the current I to the spin-orbit torque wiring 30 is stopped, the vibration of the magnetization of the first ferromagnetic layer 40 is stopped. The magnetization of the first ferromagnetic layer 40 after resonating becomes parallel or antiparallel. When the phases of two vibrations are synchronized, the directions of the two magnetizations are aligned and parallel. When the two vibrations are out of phase by half a wavelength (n), the directions of the two magnetizations are opposite and antiparallel.

When the magnetizations of two first ferromagnetic layers 40 are parallel, the resistance value of the reservoir element 300 becomes smaller than that of the antiparallel case. For example, the reservoir element 300 outputs the information of "1" when the resistance value of the reservoir element 300 is large (two magnetizations are antiparallel) and outputs the information of "0" when the resistance value is small (two magnetizations are parallel).

The current I input to the spin-orbit torque wiring 30 has various information. For example, these are the frequency, the current density, the current amount, and the like of the current I. On the other hand, the reservoir element 300 outputs information of "1" and "0" as a resistance value. That is, the reservoir element 300 according to the first embodiment converts the vibration of the magnetization of the plurality of first ferromagnetic layers 40 into a spin current and interferes in the spin conductive layer 301 to compress the information.

REFERENCE SIGNS LIST

10 First insulating layer
20 Conductive portion
20A First conductive portion
20B Second conductive portion
21 First surface
22 Second surface
23 Side surface
23A Major surface
23B, 23Ba, 23Bb, 23Bc, 23Bd, 23Be, 23Bf Third surface
23C Fourth surface
23D Fifth surface
30 Spin-orbit torque wiring
40 First ferromagnetic layer
50 Non-magnetic layer
60 Second ferromagnetic layer
70 Cap layer
31, 41, 51, 61, 71, U1 First side surface
32, 42, 52, 62, 72, U2 Second side surface
33, 43, 53, 63, 73 Third side surface
34, 44, 54, 64, 74 Fourth side surface
80 Second insulating layer
81 Gate insulating film
100, 100A, 100B, 100C, 100D, 100E, 100F, 100G Spin-orbit torque magnetoresistance effect element
120 Spin-orbit torque magnetization rotational element
200 Magnetic memory
300 Reservoir element
301 Spin conductive layer
U Underlayer

The invention claimed is:

1. A spin-orbit torque magnetization rotational element comprising:
  a first insulating layer with a first opening and a second opening;
  a first conductive portion formed inside the first opening;
  a second conductive portion formed inside the second opening;
  a spin-orbit torque wiring located in a first direction of the first insulating layer and extends in a second direction over the first conductive portion and the second conductive portion when viewed from the first direction; and
  a first ferromagnetic layer located on the side opposite to the first insulating layer in the spin-orbit torque wiring,
  wherein the first conductive portion includes a first surface facing the spin-orbit torque wiring, a second surface facing the first surface and is located at a position farther from the spin-orbit torque wiring than the first surface, and a side surface connecting the first surface and the second surface,
  wherein the side surface includes a continuous major surface and a third surface inclined or curved with respect to the major surface and is discontinuous with respect to the major surface, and
  wherein the side surface of the first conductive portion further includes a fourth surface and a fifth surface inclined or curved with respect to the major surface and the third surface and are discontinuous with respect to the major surface and the third surface.

2. The spin-orbit torque magnetization rotational element according to claim 1,
wherein the third surface is inclined or curved with respect to the first direction.

3. The spin-orbit torque magnetization rotational element according to claim 1,
wherein the third surface includes a first part inclined or curved with respect to the first direction and a second part inclined or curved with respect to the first part.

4. The spin-orbit torque magnetization rotational element according to claim 1,
wherein the spin-orbit torque wiring includes a first side surface and a second side surface in the second direction, and
wherein the first side surface is continuous to at least a part of the third surface of the first conductive portion.

5. The spin-orbit torque magnetization rotational element according to claim 1,
wherein the spin-orbit torque wiring includes a third side surface and a fourth side surface provided in a third direction intersecting the second direction,
wherein the third side surface is continuous to at least a part of the fourth surface, and
wherein the fourth side surface is continuous to at least a part of the fifth surface.

6. The spin-orbit torque magnetization rotational element according to claim 1,
wherein the first ferromagnetic layer includes a first side surface and a second side surface provided in the second direction,
wherein the first side surface of the first ferromagnetic layer is continuous to a first side surface of the spin-orbit torque wiring, and
wherein the second side surface of the first ferromagnetic layer is continuous to a second side surface of the spin-orbit torque wiring.

7. The spin-orbit torque magnetization rotational element according to claim 5,
wherein the first ferromagnetic layer includes a third side surface and a fourth side surface in a third direction intersecting the second direction,
wherein the third side surface of the first ferromagnetic layer is continuous to the third side surface of the spin-orbit torque wiring, and
wherein the fourth side surface of the first ferromagnetic layer is continuous to the fourth side surface of the spin-orbit torque wiring.

8. The spin-orbit torque magnetization rotational element according to claim 1,
wherein the spin-orbit torque wiring includes a first side surface and a second side surface provided in the second direction and includes a third side surface and a fourth side surface provided in a third direction intersecting the second direction, and
wherein an inclination angle of the first side surface with respect to the first direction is larger than inclination angles of the third side surface and the fourth side surface with respect to the first direction.

9. The spin-orbit torque magnetization rotational element according to claim 1,
wherein the spin-orbit torque wiring includes a first side surface and a second side surface in the second direction, and
wherein an inclination angle of the first side surface with respect to the second direction is 45° or more.

10. The spin-orbit torque magnetization rotational element according to claim 1, further comprising:
an underlayer provided between the spin-orbit torque wiring and the first ferromagnetic layer.

11. A spin-orbit torque magnetoresistance effect element comprising:
the spin-orbit torque magnetization rotational element according to claim 1;
a second ferromagnetic layer located in the first direction of the first ferromagnetic layer; and
a non-magnetic layer located between the first ferromagnetic layer and the second ferromagnetic layer.

12. A magnetic memory comprising:
a plurality of the spin-orbit torque magnetoresistance effect elements according to claim 11; and
a wiring connecting the plurality of spin-orbit torque magnetoresistance effect elements.

13. A reservoir element comprising:
a plurality of the spin-orbit torque magnetization rotational elements according to claim 1; and
a spin conductive layer connecting the first ferromagnetic layers of the plurality of spin-orbit torque magnetization rotational elements.

* * * * *